(12) United States Patent
Kita et al.

(10) Patent No.: US 10,685,995 B2
(45) Date of Patent: Jun. 16, 2020

(54) IMAGE SENSOR AND IMAGE-CAPTURING DEVICE

(71) Applicant: NIKON CORPORATION, Tokyo (JP)

(72) Inventors: Yuki Kita, Kawasaki (JP); Shiro Tsunai, Kawasaki (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/068,056

(22) PCT Filed: Jan. 6, 2017

(86) PCT No.: PCT/JP2017/000247
§ 371 (c)(1),
(2) Date: Jul. 3, 2018

(87) PCT Pub. No.: WO2017/119477
PCT Pub. Date: Jul. 13, 2017

(65) Prior Publication Data
US 2019/0074307 A1 Mar. 7, 2019

(30) Foreign Application Priority Data

Jan. 8, 2016 (JP) ................. 2016-002730

(51) Int. Cl.
*H04N 5/341* (2011.01)
*H01L 27/146* (2006.01)
*H04N 5/369* (2011.01)
*H04N 5/355* (2011.01)

(52) U.S. Cl.
CPC ...... *H01L 27/14605* (2013.01); *H01L 27/146* (2013.01); *H01L 27/14645* (2013.01); *H01L 27/14667* (2013.01); *H04N 5/341* (2013.01); *H04N 5/355* (2013.01); *H04N 5/369* (2013.01); *H01L 27/14621* (2013.01)

(58) Field of Classification Search
CPC ..................................................... H04N 5/341
USPC ....................................................... 348/308
See application file for complete search history.

(56) References Cited

U.S. PATENT DOCUMENTS

2004/0223075 A1* 11/2004 Furlan .................. H04N 5/2254
348/363
2013/0182173 A1 7/2013 Murata
2016/0105622 A1 4/2016 Tamaki
(Continued)

FOREIGN PATENT DOCUMENTS

| JP | 2012-169584 A | 9/2012 |
| JP | 2013-145292 A | 7/2013 |
| JP | 2014-067948 A | 4/2014 |

(Continued)

OTHER PUBLICATIONS

Feb. 21, 2017 International Search Report issued in International Patent Application No. PCT/JP2017/000247.
(Continued)

*Primary Examiner* — Joel W Fosselman
(74) *Attorney, Agent, or Firm* — Oliff PLC

(57) ABSTRACT

An image sensor includes: a photoelectric conversion layer where light having entered therein undergoes photoelectric conversion; a first electrode disposed at one surface located on one side of the photoelectric conversion layer; and a second electrode disposed at the one surface so as to surround the first electrode.

13 Claims, 25 Drawing Sheets

(56) References Cited

U.S. PATENT DOCUMENTS

2016/0182792 A1 6/2016 Aoki et al.
2016/0219233 A1 7/2016 Murata

FOREIGN PATENT DOCUMENTS

JP 2016-076921 A 5/2016
WO 2015/046045 A1 4/2015

OTHER PUBLICATIONS

Jul. 23, 2019 Office Action issued in Japanese Patent Application No. 2017-560428.

* cited by examiner (a)

(b)

(a)

(b)

(c)

(a)

(b)

(c)

(a)

(b)

(c)

(a)    (b)

(a)

(b)

(c)

IMAGE SENSOR AND IMAGE-CAPTURING DEVICE

TECHNICAL FIELD

The present invention relates to an image sensor and an image-capturing device.

BACKGROUND ART

Image sensors having disposed therein pixels each of which includes an organic photoelectric conversion film are known in the related art.

The image sensors in the related art, however, are limited in that the size of the light-receiving area at each pixel cannot be adjusted.

CITATION LIST

Patent Literature

PTL 1: Japanese Laid Open Patent Publication No. 2012-169584

SUMMARY OF INVENTION

According to the first aspect of the present invention, an image sensor, comprises: a photoelectric conversion layer where light having entered therein undergoes photoelectric conversion; a first electrode disposed at one surface located on one side of the photoelectric conversion layer; and a second electrode disposed at the one surface so as to surround the first electrode.

According to the second aspect of the present invention, in the image sensor according to the first aspect, it is preferred that the second electrode surrounds the first electrode along an entire periphery thereof.

According to the third aspect of the present invention, in the image sensor according to the first or second aspect, it is preferred that the first electrode and the second electrode are disposed in a concentric pattern.

According to the fourth aspect of the present invention, in the image sensor according to any one of the first through third aspects, it is preferred that further comprises a third electrode disposed at the one surface so as to surround the second electrode.

According to the fifth aspect of the present invention, in the image sensor according to any one of the first through fourth aspects, it is preferred that further comprises: a first image sensor unit having disposed therein a plurality of first pixels, each of which includes the photoelectric conversion layer, the first electrode and the second electrode; and a second image sensor unit having disposed therein a plurality of second pixels, each of which receives transmitted light having been transmitted through the photoelectric conversion layer, the first electrode and the second electrode in the first image sensor unit.

According to the sixth aspect of the present invention, in the image sensor according to the fifth aspect, it is preferred that the second pixels in the second image sensor unit are formed on a semiconductor substrate.

According to the seventh aspect of the present invention, in the image sensor according to the fifth aspect, it is preferred that the second pixels in the second image sensor unit each include a photoelectric conversion unit that receives a light flux having passed through a pupil area of a photographing optical system set to a maximum aperture F number.

According to the eighth aspect of the present invention, an image-capturing device, comprises: an image sensor according to any one of the fifth through seventh aspects; a first image generation unit that generates first image data having a first depth of field by using photoelectric conversion signals each generated based upon either the first electrode or the second electrode in each of the first pixels; and a second image data generation unit that generates second image data having a second depth of field by using photoelectric conversion signals provided from photoelectric conversion units in the second pixels.

According to the ninth aspect of the present invention, in the image-capturing device according to the eighth aspect, it is preferred that further comprises: a third image generation unit that generates third image data having both the first depth of field and the second depth of field by using the photoelectric conversion signals generated based upon either the first electrode or the second electrode in each of the first pixels and the photoelectric conversion signals provided from the photoelectric conversion units in the second pixels.

According to the tenth aspect of the present invention, an image-capturing device, comprises: an image sensor according to any one of the first through fourth aspects that includes a first image sensor unit having disposed therein a plurality of first pixels, each of which includes the photoelectric conversion layer, the first electrode and the second electrode; a luminance detection unit that detects luminance of a photographic subject at an image-capturing surface of the first image sensor unit; and a readout unit that reads out a photoelectric conversion signal generated based upon either of or both of the first electrode and the second electrode in correspondence to the luminance of the photographic subject detected by the luminance detection unit.

According to the eleventh aspect of the present invention, in the image-capturing device according to the tenth aspect, it is preferred that further comprises: a correction unit that corrects the photoelectric conversion signal read out by the readout unit, wherein: the luminance detection unit detects a photographic subject luminance level at each first pixel; if the photographic subject luminance level at the first pixel detected by the luminance detection unit is determined to be equal to or higher than a predetermined luminance level, the readout unit reads out a photoelectric conversion signal generated based upon either the first electrode or the second electrode, whereas if the photographic subject luminance at the first pixel detected by the luminance detection unit is determined to be less than the predetermined luminance level, the readout unit reads out a photoelectric conversion signal generated based upon both the first electrode and the second electrode; and the correction unit corrects the photoelectric conversion signal in correspondence to the photographic subject luminance level at each first pixel detected by the luminance detection unit.

According to the twelfth aspect of the present invention, an image-capturing device, comprises: an image sensor having disposed therein a plurality of pixels, each of which includes a photoelectric conversion layer where light having entered therein undergoes photoelectric conversion, a first electrode and a second electrode, wherein the pixels made up with a plurality of types of pixels having different spectral sensitivity characteristics; and an adding unit that adds together photoelectric conversion signals provided from a pair of pixels disposed next to each other and having different spectral sensitivity characteristics with one of the photoelectric conversion signals being a photoelectric conversion signal generated based upon either the first electrode or the second electrode in one pixel of the pair, located closer to another pixel of the pair, and another being a photoelectric conversion signal generated based upon the first electrode or the second electrode in the other pixel located closer to the one pixel.

According to the thirteenth aspect of the present invention, in the image-capturing device according to the twelfth aspect, it is preferred that the pixels are disposed along a row direction in which rows extend and along a column direction in which columns extend; the pixels each further include a third electrode and a fourth electrode with the first electrode, the second electrode, the third electrode and the fourth electrode disposed along the row direction and the column direction in a 2×2 pattern; and in conjunction with a pair of pixels made up with one pixel and another pixel having different spectral sensitivity characteristics disposed next to each other along the row direction, the adding unit generates a first sum photoelectric conversion signal by adding together two photoelectric conversion signals originating in the one pixel, which are generated based upon two electrodes among the first through fourth electrodes in the one pixel located closer to the other pixel, and two photoelectric conversion signals originating in the other pixel, which are generated based upon two electrodes among the first through fourth electrodes in the other pixel located closer to the one pixel, and in conjunction with a pair of pixels made up with one pixel and another pixel having different spectral sensitivity characteristics disposed next to each other along the column direction, the adding unit generates a second sum photoelectric conversion signal by adding together two photoelectric conversion signals originating in the one pixel, which are generated based upon two electrodes among the first through fourth electrodes in the one pixel located closer to the other pixel, and two photoelectric conversion signals originating in the other pixel, which are generated based upon two electrodes among the first through fourth electrodes in the other pixel located closer to the one pixel.

According to the fourteenth aspect of the present invention, in the image-capturing device according to the thirteenth aspect, it is preferred that the adding unit generates a third sum photoelectric conversion signal by adding together four photoelectric conversion signals generated based upon the first through fourth electrodes in each pixel; and the image-capturing device further comprises an image data generation unit that generates image data based upon at least either of the first sum photoelectric conversion signal and the second sum photoelectric conversion signal, and the third sum photoelectric conversion signal.

According to the fifteenth aspect of the present invention, in the image-capturing device according to the thirteenth aspect, it is preferred that the image sensor includes a first image sensor unit constituted with first pixels, each having the photoelectric conversion layer and the first through fourth electrodes disposed therein, arrayed along the row direction and along the column direction, and a second image sensor unit constituted with second pixels each of which receives transmitted light having been transmitted through the photoelectric conversion layer and the first through fourth electrodes in the first image sensor unit, arrayed along the row direction and the column direction; and the image-capturing device further comprises an image data generation unit that generates image data based upon at least either of the first sum photoelectric conversion signal and the second sum photoelectric conversion signal, and a photoelectric conversion signal provided from a photoelectric conversion unit in each of the second pixels.

According to the sixteenth aspect of the present invention, an image-capturing device, comprises: a first image sensor unit having a plurality of first pixels, each of which includes a first photoelectric conversion area and a second photoelectric conversion area; a second image sensor unit having a plurality of second pixels which individually receive transmitted light having been individually transmitted through the plurality of first pixels; and an exposure control unit that executes exposure control for the second pixels at a first exposure value, executes exposure control for the first photoelectric conversion area in each of the first pixels at a second exposure value greater than the first exposure value, and executes exposure control for the second photoelectric conversion area in each of the first pixels at a third exposure value smaller than the first exposure value.

According to the seventeenth aspect of the present invention, an image-capturing device, comprises: a first image sensor unit having a plurality of first pixels; a second image sensor unit having a plurality of second pixels which individually receive transmitted light having been individually transmitted through the plurality of first pixels, with the second pixels each having a first photoelectric conversion area and a second photoelectric conversion area formed therein; and an exposure control unit that executes exposure control for the first pixels at a first exposure value, executes exposure control for the first photoelectric conversion area in each of the second pixels at a second exposure value greater than the first exposure value, and executes exposure control for the second photoelectric conversion area in each of the second pixels at a third exposure value smaller than the first exposure value.

According to the eighteenth aspect of the present invention, in the image-capturing device according to the sixteenth or seventeenth aspect, it is preferred that the first exposure value is an optimal exposure value.

According to the nineteenth aspect of the present invention, in the image-capturing device according to the sixteenth aspect, it is preferred that the first pixels each output a first photoelectric conversion signal generated based upon the first photoelectric conversion area and a second photoelectric conversion signal generated based upon the second photoelectric conversion area; the second pixels each output a third photoelectric conversion signal; and the image-capturing device further comprises an image data generation unit that generates first image data, second image data and third image data respectively based upon the first photoelectric conversion signal, the second photoelectric conversion signal and the third photoelectric conversion signal, and synthesizes image data by combining the first image data, the second image data and the third image data.

According to the twentieth aspect of the present invention, in the image-capturing device according to the seventeenth aspect, it is preferred that the first pixels each output a first photoelectric conversion signal; the second pixels each output a second photoelectric conversion signal generated based upon the first photoelectric conversion area and a third photoelectric conversion signal generated based upon the second photoelectric conversion area; and the image-capturing device further comprises an image data generation unit that generates first image data, second image data and third image data respectively based upon the first photoelectric conversion signal, the second photoelectric conversion signal and the third photoelectric conversion signal, and synthesizes image data by combining the first image data, the second image data and the third image data.

According to the twenty-first aspect of the present invention, in the image-capturing device according to the sixteenth through twentieth aspect, it is preferred that the first photoelectric conversion area and the second photoelectric conversion area each include a plurality of area portions; and the area portions in the first photoelectric conversion area and the area portions in the second photoelectric conversion area are set so as to together form a checkered pattern.

DESCRIPTION OF EMBODIMENTS

—First Embodiment—

Figure 1:
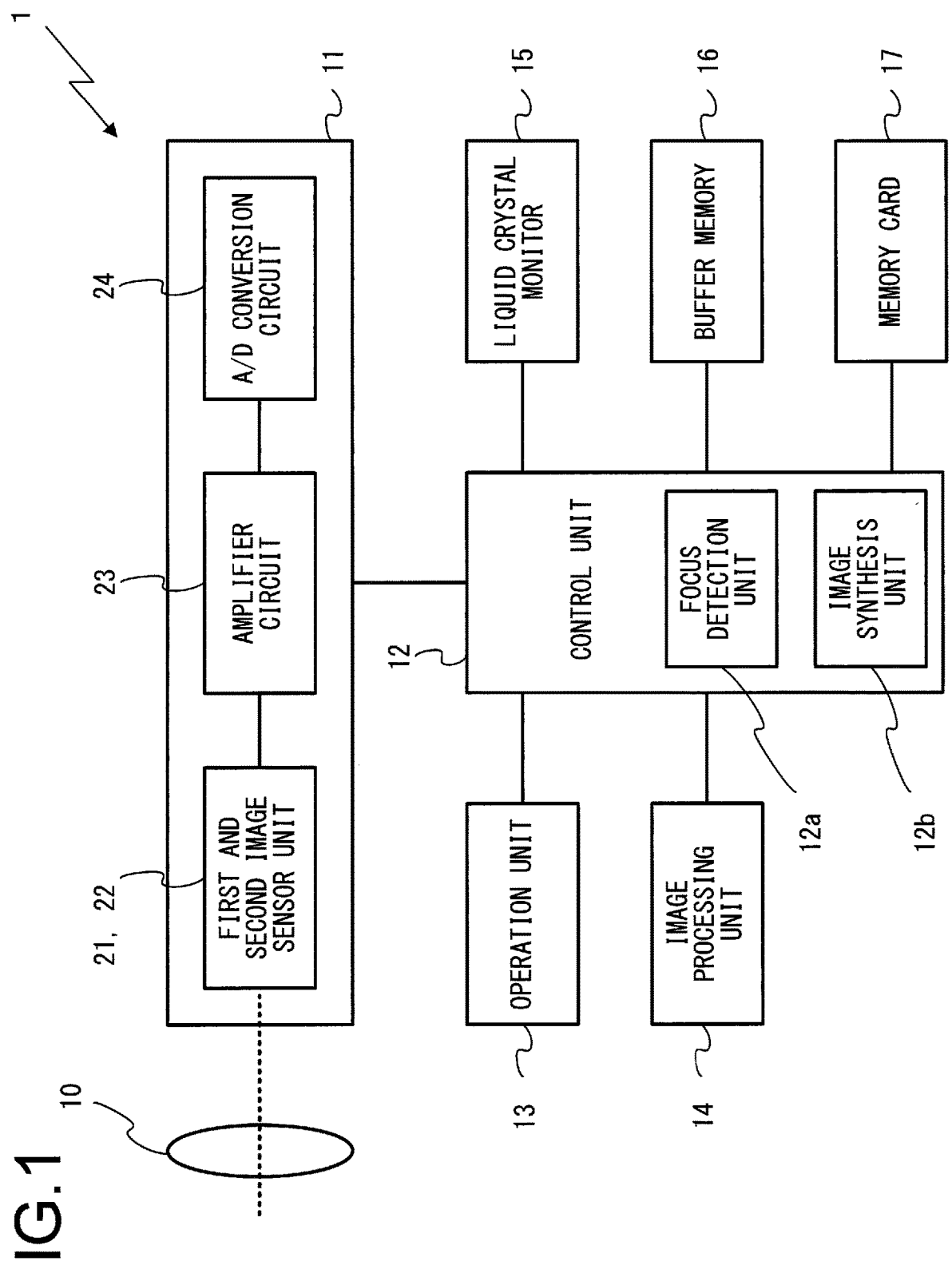
FIG. 1 A diagram presenting an example of a structure that may be adopted in a digital camera according to a first embodiment FIG. 2 An overview of the first and second image sensor units FIG. 3 A diagram indicating the positional arrangement of pixels in 10 rows×6 columns at part of the first image sensor unit, presented in (a), and a diagram indicating the positional arrangement of pixels in 10 rows×6 columns at part of the second image sensor unit, presented in (b)

FIG. 1 is a diagram presenting a structural example for a digital camera 1 according to the first embodiment of the present invention. The digital camera 1 includes a photographing optical system 10, an image-capturing unit 11, a control unit 12, an operation unit 13, an image processing unit 14, a liquid crystal monitor 15 and a buffer memory 16. In addition, a memory card 17 is loaded to the digital camera 1. The memory card 17, constituted with a non-volatile flash memory or the like, can be detachably loaded into the digital camera 1.

The photographing optical system 10, configured with a plurality of lenses and an aperture, forms a subject image onto the image-capturing surface of the image-capturing unit 11. The plurality of lenses constituting the photographing optical system 10 includes a focusing lens that is driven along the optical axis for purposes of focus adjustment. The focusing lens is driven along the optical axis by a lens drive unit (not shown).

The image-capturing unit 11 includes an image sensor configured with a first image sensor unit 21 and a second image sensor unit 22 laminated one on top of the other, an amplifier circuit 23 and an A/D conversion circuit 24. The first and second image sensor units 21 and 22, each constituted with a plurality of pixels arranged in a two-dimensional array, receive light through the photographing optical system 10 from a photographic subject and output photoelectric conversion signals resulting from photoelectric conversion of the light received therein. As will be described in detail later, the pixels in the first and second image sensor units 21 and 22 each output an analog photoelectric conversion signal. These photoelectric conversion signals are used as signals for photographic image generation. The amplifier circuit 23 amplifies the photoelectric conversion signals at a predetermined amplification factor (gain) and outputs the resulting signals to the A/D conversion circuit 24. The photoelectric conversion signals undergo A/D conversion at the A/D conversion circuit 24.

It is to be noted that the first and second image sensor units 21 and 22 start executing image-capturing operations, i.e., exposure operations, simultaneously.

The control unit 12, constituted with a microprocessor and its peripheral circuits, executes various types of control for the digital camera 1 by executing a control program installed in a ROM (not shown). In addition, the control unit 12 includes a focus detection unit 12a and an image synthesis unit 12b in the form of functional units. These functional units are provided in software based upon the control program mentioned above. It is to be noted that the functional units may instead be constituted as electronic circuits.

The control unit 12 stores the photoelectric conversion signals resulting from the A/D conversion executed at the A/D conversion circuit 24 into the buffer memory 16. The focus detection unit 12a executes focus detection processing, individually based upon the photoelectric conversion signals stored in the buffer memory 16, which have originated at the first image sensor unit 21, and/or based upon the photoelectric conversion signals stored in the buffer memory 16, which have originated at the second image sensor unit 22, through a contrast detection method of the known art.

The image processing unit 14 may be constituted with, for instance, an ASIC. The image processing unit 14 generates image data by executing various types of image processing, such as interpolation processing, compression processing and white balance processing, on the photoelectric conversion signals provided from the first and second image sensor units 21 and 22. The image synthesis unit 12b generates composite image data by combining image data generated based upon the photoelectric conversion signals provided from the first image sensor unit 21 and image data generated based upon the photoelectric conversion signals provided from the second image sensor unit 22. The image data and the composite image data thus generated are brought up on display at the liquid crystal monitor 15 and stored into the memory card 17.

The operation unit 13, constituted with various types of operation members including a shutter release operation member, a mode selection operation member, a focus detection area setting operation member and a power on/off operation member, is operated by the photographer. The mode selection operation member is used to select and set, for instance, a multiple focal depth (depth of field) photographing mode or a high dynamic range photographing mode, which will be explained in detail later. The operation unit 13 outputs an operation signal, which corresponds to an operation performed by the photographer at an operation member among the operation members listed above, to the control unit 12.

(Description of the First and Second Image Sensor Units 21 and 22)

Figure 2:
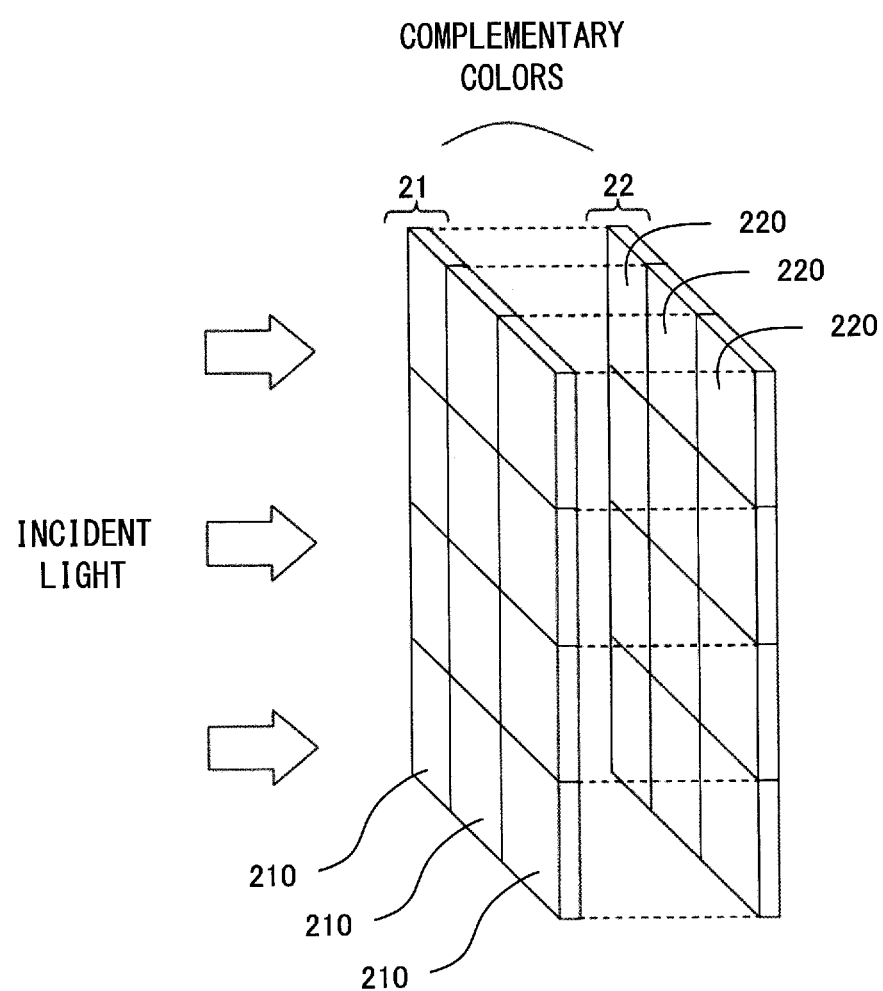

FIG. 2 provides an overview of the first and second image sensor units 21 and 22 according to the present embodiment. The image sensor includes the first and second image sensor units 21 and 21 laminated one on top of the other. The first image sensor unit 21 includes organic photoelectric conversion films that function as photoelectric conversion units, whereas the second image sensor unit 22 includes photodiodes formed at a semiconductor substrate, which function as photoelectric conversion units. The first image sensor unit 21 is laminated on the second image sensor unit 22, and the first and second image sensor units 21 and 22 are disposed in the optical path of the photographing optical system 10 so that the optical axis of the photographing optical system 10 shown in FIG. 1 passes through the centers of the image-capturing surfaces of the first and second image sensor units 21 and 22. It is to be noted that while FIG. 2 shows pixels 210 and 220 in 4 rows×3 columns at the first and second image sensor units 21 and 22 so as to simplify the illustration, pixels in m rows×n columns at each of the first image sensor unit 21 and the second image sensor unit 22 in the present embodiment and the size of the pixels in the first image sensor unit 21 matches the size of the pixels in the second image sensor unit 22.

The pixels 210 in the first image sensor unit 21 each include an organic photoelectric conversion film that absorbs (photoelectric converses) light corresponding to the predetermined color component. The light that has not been absorbed (that has not undergone photoelectric conversion) at the first image sensor unit 21 is transmitted through the first image sensor unit 21, enters the second image sensor unit 22 and undergoes photoelectric conversion at the second image sensor unit 22. It is to be noted that the color component of the light that undergoes photoelectric conversion at the first image sensor unit 21 and the color component of the light that undergoes photoelectric conversion at the second image sensor unit 22 are in a relation of complementary color to each other. To describe this in further detail, a given pixel 210 at the first image sensor unit 21 corresponds to a pixel 220 at the second image sensor unit 22, disposed at the position directly behind the pixel 210, i.e., the pixels 210 at the first image sensor unit 21 each correspond to the pixel 220 at the second image sensor unit 22, which receives the light having passed through the particular pixel 210, and at the pixels 210 and 220 in the first and second image sensor units 21 and 22 that correspond to each other as described above, complementary color components of light are absorbed and undergo photoelectric conversion.

Figure 3:
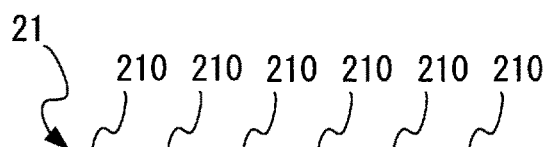
Figure 3:
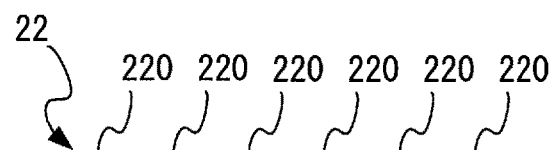

In FIG. 3, the positional arrangement of pixels 210 in 10 rows×6 columns at part of the first image sensor unit 21 and the positional arrangement of pixels 220 in 10 rows×6 columns at part of the second image sensor unit 22 are individually illustrated. In FIG. 3(a), each pixel 210 marked "Mg" in the first image sensor unit 21 is a pixel at which light with a magenta color component is absorbed and undergoes photoelectric conversion, i.e., a pixel having magenta spectral sensitivity. Likewise, each pixel 210 marked "Ye" is a pixel at which light with a yellow color component is absorbed and undergoes photoelectric conversion, i.e., a pixel having yellow spectral sensitivity, and each pixel 210 marked "Cy" is a pixel at which light with a cyan color component is absorbed and undergoes photoelectric conversion, i.e., a pixel having cyan spectral sensitivity. In the first image sensor unit 21, the columnar pixel positions in each odd-numbered row are alternately taken up by an "Mg" pixel 210 and a "Ye" pixel 210 and the columnar pixel positions in each even-numbered row are alternately taken up by a "Cy" pixel 210 and an "Mg" pixel 210.

In FIG. 3(b), each pixel 220 marked "G" in the second image sensor unit 22 is a pixel at which light with a green color component is absorbed and undergoes photoelectric conversion, i.e., a pixel having green spectral sensitivity. Likewise, each pixel 210 marked "B" is a pixel at which light with a blue color component is absorbed and undergoes photoelectric conversion, i.e., a pixel having blue spectral sensitivity, and each pixel 210 marked "R" is a pixel at which light with a red color component is absorbed and undergoes photoelectric conversion, i.e., a pixel having red spectral sensitivity. In the second image sensor unit 22, the columnar pixel positions in each odd-numbered row are alternately taken up by a "G" pixel 220 and a "B" pixel 220 and the columnar pixel positions in each even-numbered row are alternately taken up by an "R" pixel 220 and a "G" pixel 220. Namely, the pixels are disposed in a Bayer array at the second image sensor unit 22.

In FIGS. 3(a) and 3(b), the "Mg" pixels 210 in the first image sensor unit 21 each correspond to one of the "G"

pixels 220 in the second image sensor unit 22, the "Ye" pixels 210 in the first image sensor unit 21 each correspond to one of the "B" pixels 220 in the second image sensor unit 22, and the "Cy" pixels 210 in the first image sensor unit 21 each correspond to one of the "R" pixels 220 in the second image sensor unit 22.

As described above, the first image sensor unit 21, which includes organic photoelectric conversion films, fulfills a function of color filters for the second image sensor unit 22, and a complementary color image of the color image of the first image sensor unit 21 (a Bayer array image in the example presented in FIG. 3) is obtained from the second image sensor unit 22. This means that a CMY image, composed with the three colors Cy, Mg and Ye, can be obtained from the first image sensor unit 21, whereas an RGB image composed with the three colors R, G and B can be obtained from the second image sensor unit 22. It is to be noted that the CMY image obtained based upon the first image sensor unit 21 is converted to an RGB image through a color system conversion processing of the known art executed by the image processing unit 14 shown in FIG. 1.

Figure 4:
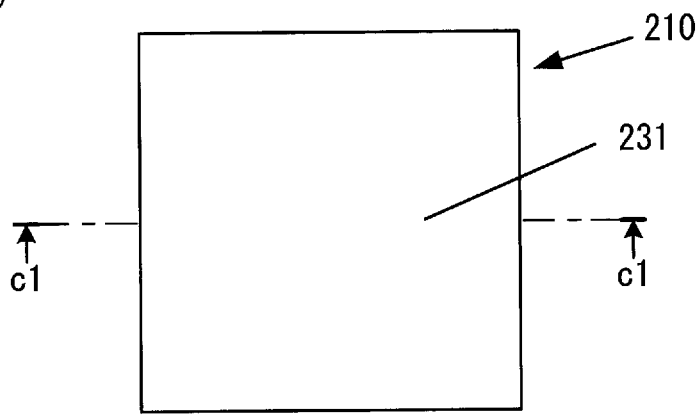
FIG. 4 Illustrations of a pixel at the first image sensor unit with (a) presenting a view of the pixel from the subject side, (b) presenting a view of the pixel from the opposite side of the subject side and (c) presenting a sectional view taken through c1-c1 in (a)
Figure 4:
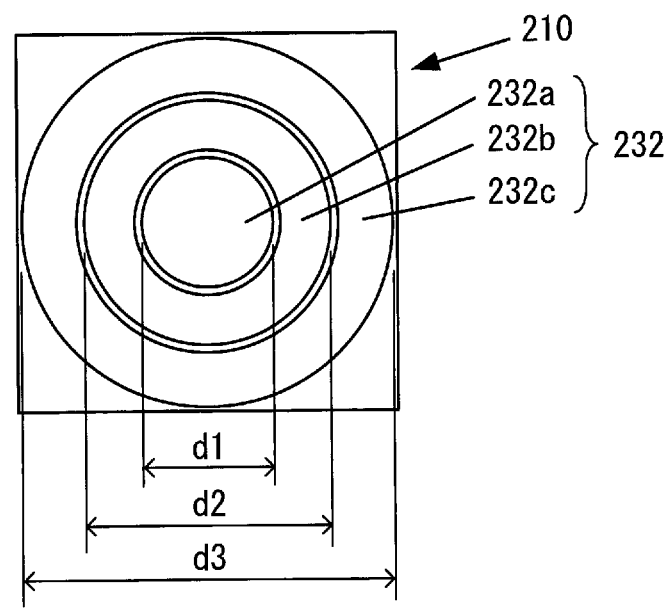
Figure 4:
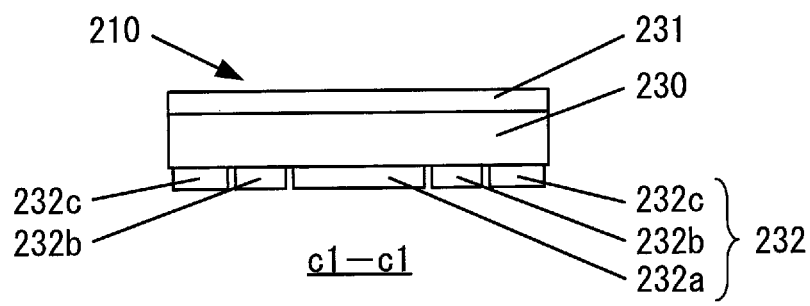

FIGS. 4(a) through 4(c) schematically illustrate the structure of the pixel 210 in the first image sensor unit 21. FIG. 4(a) shows a view of the pixel 210 in the first image sensor unit 21 from the subject side, FIG. 4(b) shows a view of the pixel 210 from the opposite side of the subject side, and FIG. 4(c) is a sectional view taken through c1-c1 in FIG. 4(a). The pixels 210 in the first image sensor unit 21 each include an organic photoelectric conversion film 230 that absorbs light with the magenta color component, the yellow color component or the cyan color component, a transparent common electrode 231 formed at the upper surface of the organic photoelectric conversion film 230, i.e., at the surface of the organic photoelectric conversion film 230 located toward the subject, and transparent partial electrodes 232 formed at the lower surface of the organic photoelectric conversion film 230. The partial electrodes 232 include first through third partial electrodes 232a, 232b and 232c. It is to be noted that the common electrode 231 may also be referred to as an upper electrode layer and the first through third partial electrodes 232a, 232b and 232c may also be referred to as a lower electrode layer. In addition, the organic photoelectric conversion film 230 may otherwise be referred to as a photoelectric conversion layer.

As shown In FIG. 4(b), the first partial electrode 232a is a circular electrode disposed at the center of the pixel 210. The second partial electrode 232b is an annular electrode that surrounds the first partial electrode 232a along its entire circumference. The third partial electrode 232c is an annular electrode that surrounds the second partial electrode 232b along its entire circumference. This means that an outer diameter d2 of the second partial electrode 232b is greater than an outer diameter d1 of the first partial electrode 232a, and that an outer diameter d3 of the third partial electrode 232c is greater than the outer diameter d2 of the second partial electrode 232b.

In the pixel 210 structured as described above, the area from which an electric charge generated in the organic photoelectric conversion film 230 is to be read out, can be selected in correspondence to a specific combination of the first through third partial electrodes 232a through 232c.

The common electrode 231 may be formed as a common electrode shared by all the pixels 210 in the first image sensor unit 21, or as a common electrode within each pixel 210. In other words, the common electrode 231 may be a common electrode shared among all the pixels 210 or may be a common electrode used in correspondence to the individual partial electrodes 232a through 232c within each pixel.

Figure 5:
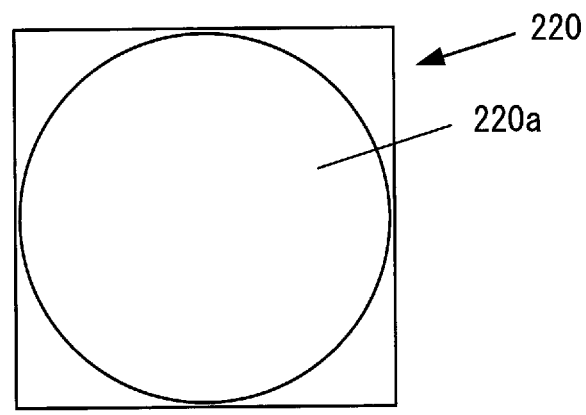
FIG. 5 A schematic illustration of the structure adopted in the pixels in the second image sensor unit in a view of one of the pixels in the second image sensor unit from the subject side FIG. 6 A sectional view showing the structure of a pixel in the first and second image sensor units FIG. 7 A diagram presenting a structural example that may be adopted for the signal readout circuit at a pixel in the first image sensor unit FIG. 8 Illustrations of the photoelectric conversion area where the electric charge is read out at the organic photoelectric conversion film in a pixel, viewed from the subject side FIG. 9 A block diagram in reference to which a high dynamic range photographing mode is to be explained FIG. 10 Illustrations of the photoelectric conversion area, according to a variation, where the electric charge is read out at the organic photoelectric conversion film in a pixel, viewed from the subject side FIG. 11 Illustrations of partial electrodes according to variations FIG. 12 A diagram presenting an example of a structure that may be adopted in a digital camera according to a second embodiment FIG. 13 A diagram indicating the positional arrangement of pixels in 10 rows×6 columns at part of the first image sensor unit, presented in (a), and a diagram indicating the positional arrangement of pixels in 10 rows×6 columns at part of the second image sensor unit, presented in (b)

FIG. 5 schematically illustrates the structure adopted in the pixels 220 at the second image sensor unit 22 in a view of one of the pixels 220 in the second image sensor unit 22, taken from the subject side. The pixel 220 includes a circular photoelectric conversion unit 220a. The outer diameter of the photoelectric conversion unit 220a is equal to the outer diameter d3 of the third partial electrode 232c in the pixel 210 at the first image sensor unit 21. It is to be noted that the photoelectric conversion unit 220a receives a light flux having passed through the entire range of the pupil area corresponding to the maximum aperture F number of the photographing optical system 10.

Figure 6:
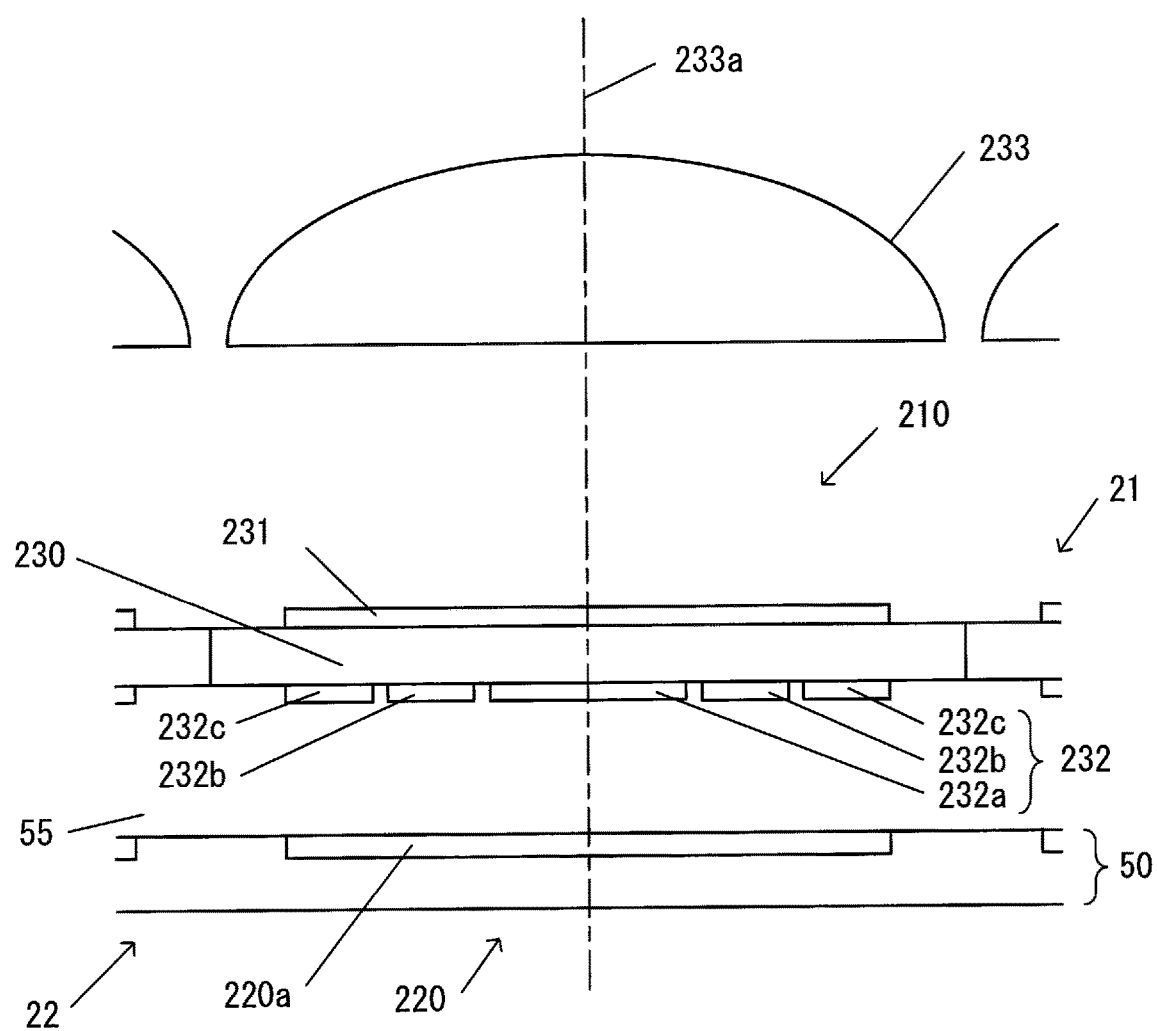

FIG. 6 is a sectional view showing a structure of the pixel 210 and the pixel 220 in the first and second image sensor units 21 and 22. As FIG. 6 indicates, the second image sensor unit 22 is formed on a semiconductor substrate 50, and the pixels 220 disposed therein, each includes a photoelectric conversion unit 220a. At the surface, i.e., the upper surface, of the second image sensor unit 22, the first image sensor unit 21 is laminated through a planarization layer 55. A wiring layer (not shown) is formed inside the planarization layer 55.

In addition, a microlens 233 is disposed above each of the pixels 210 in the first image sensor unit 21, and the microlens 233, the corresponding pixel 210 in the first image sensor unit 21 and the corresponding pixel 220 in the second image sensor unit 22 are disposed in an orderly alignment along the optical axis of the microlens 233.

Figure 7:
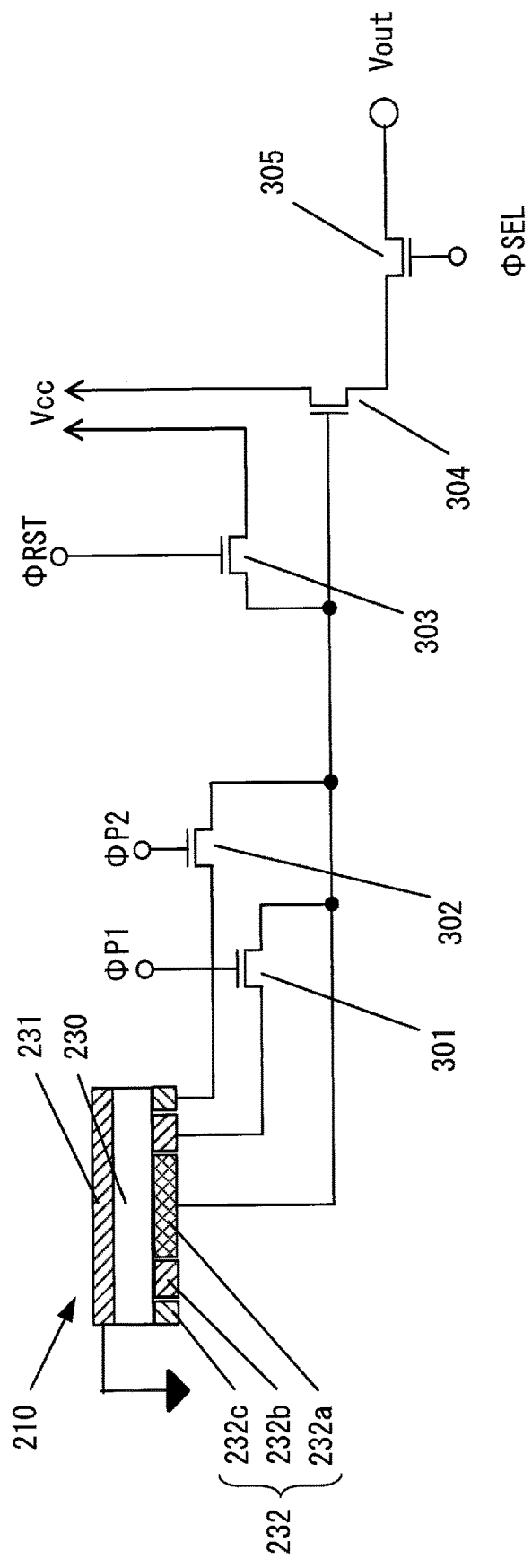

FIG. 7 is a diagram presenting an example of a circuit structure that may be adopted in the signal readout circuit for a pixel 210 in the first image sensor unit 21. The signal readout circuit for each pixel 210 includes electrode selection transistors 301 and 302, a reset transistor 303, an output transistor 304 and a row selection transistor 305. The common electrode 231 is connected to the ground. The first partial electrode 232a is connected to the gate of the output transistor 304. The second partial electrode 232b and the gate of the output transistor 303 are connected with each other through the electrode selection transistor 301, whereas the third partial electrode 232c and the gate of the output transistor 304 are connected with each other through the electrode selection transistor 302.

The output transistor 304 amplifies a voltage signal generated based upon an electric charge provided from the first partial electrode 232a. In addition, as the electrode selection transistor 301 is turned on, i.e., as the electrode selection transistor 301 enters a conduction state, an electric charge provided from the second partial electrode 232b is added to the electric charge provided from the first partial electrode 232a, and a voltage signal generated based upon an electric charge representing the sum is amplified by the output transistor 304. As the electrode selection transistors 301 and 302 are both turned on, the electric charge provided from the second partial electrode 232b and an electric charge provided from the third partial electrode 231c are added to the electric charge provided from the first partial electrode 232a, and a voltage signal generated based upon an electric charge representing the sum is amplified by the output transistor 304. Furthermore, as the electrode selection transistor 302 is turned on while the electrode selection transistor 301 is kept in an off state, the electric charge provided from the third partial electrode 231c is added to the electric charge provided from the first partial electrode 232a, and a voltage signal generated based upon an electric charge representing the sum is amplified by the output transistor 304.

A signal having been amplified by the output transistor 304 is read out from a terminal Vout via the row selection transistor 305. The reset transistor 303 allows excess electric charge to be discharged (i.e., so as to reset to a predetermined potential) in response to a reset signal φRST.

It is to be noted that since the signal readout circuit for each pixel 220 in the second image sensor unit 22 is achieved by adopting a structure of the known art, an explanation is not provided.

—Area Through which an Electric Charge is Read Out from a Pixel 210—

Figure 8:
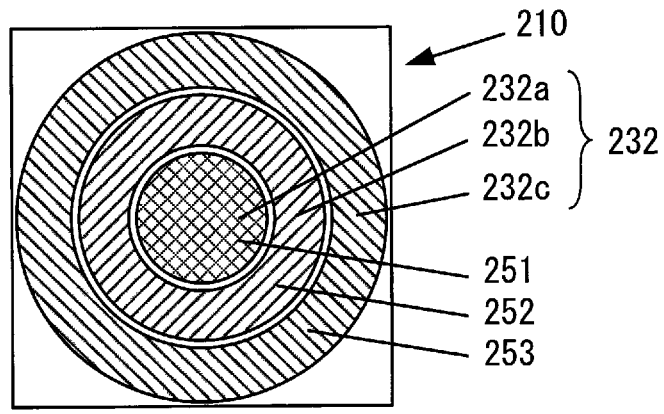
Figure 8:
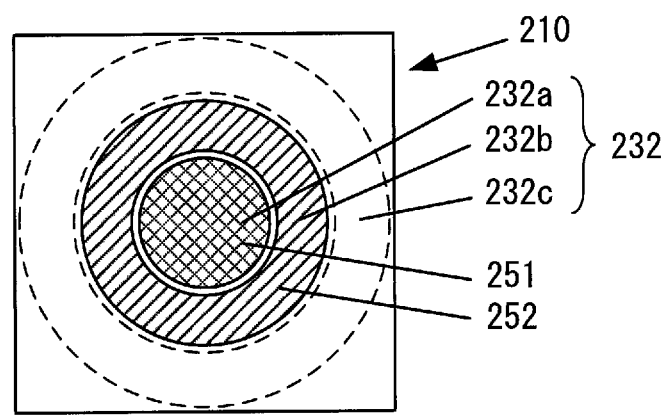
Figure 8:
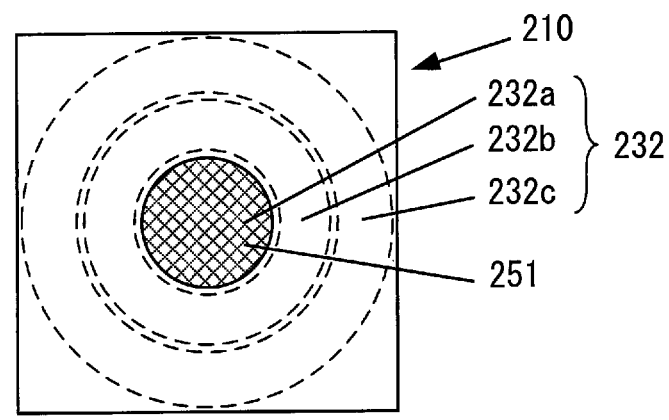

In reference to FIG. 8, an example in which a plurality of photoelectric conversion areas are formed in the organic photoelectric conversion film 230 at the pixel 210, in correspondence to the on/off states of the electrode selection transistors 301 and 302, will be explained. FIGS. 8(*a*) through 8(*c*) show photoelectric conversion areas, viewed from the subject side, through which electric charges are read out at the organic photoelectric conversion film 230 in the pixel 210. As explained below, the photoelectric conversion areas through which electric charges generated at the organic photoelectric conversion film 230 can be read out in the first image sensor unit 21 are part of the area located between the common electrode 231 and the first through third partial electrodes 232*a* through 232*c*, over which the common electrode 231 and a partial electrode used for readout, overlap.

(1) Electric Charge Readout Area Pattern in FIG. 8(*a*)

FIG. 8(*a*) presents an example in which first through third photoelectric conversion areas 251 through 253 are formed in the organic photoelectric conversion film 230. The first photoelectric conversion area 251 corresponds to an area of the organic photoelectric conversion film 230 which is covered by the first partial electrode 232*a*, the second photoelectric conversion area 252 corresponds to an area of the organic photoelectric conversion film 230 which is covered by the second partial electrode 232*b* and the third photoelectric conversion area 253 corresponds to an area of the organic photoelectric conversion film 230 which is covered by the third partial electrode 232*c*. In order to read out a photoelectric conversion signal generated based upon an electric charge representing the sum of the electric charges provided from the first through third photoelectric conversion areas 251 through 253, the electrode selection transistors 301 and 302 are turned on with control signals φP1 and φP2.

As the electrode selection transistors 301 and 302 are turned on in response to the control signals φP1 and φP2, an electric charge sum of the electric charge generated in the overlapping area where the common electrode 231 overlaps the first partial electrode 232*a*, the electric charge generated in the overlapping area where the common electrode 231 overlaps the second partial electrode 231*b* in the organic photoelectric conversion film 230 and the electric charge generated in the overlapping area where the common electrode 231 overlaps the third partial electrode 232*c* in the organic photoelectric conversion film 230 is output to the gate of the output transistor 304. As a result, a photoelectric conversion signal generated based upon the electric charge sum, i.e., the sum of the electric charges generated in the first through third photoelectric conversion areas 251 through 253 indicated as hatched areas in FIG. 8(*a*), is read out from the terminal Vout. The image processing unit 14 in FIG. 1 generates image data based upon the photoelectric conversion signal thus read out.

It is to be noted that the image data express an image that would be obtained in the case wherein the photographing optical system 10 is set to the maximum aperture F number.

It is to be noted that a photoelectric conversion signal generated based upon the electric charge generated in the first photoelectric conversion area 251 may also be referred to as a first partial electrode 232*a*-based photoelectric conversion signal, that a photoelectric conversion signal generated based upon the electric charge generated in the second photoelectric conversion area 252 may also be referred to as a second partial electrode 232*b*-based photoelectric conversion signal and that a photoelectric conversion signal generated based upon the electric charge generated in the third photoelectric conversion area 253 may also be referred to as a third partial electrode 232*c*-based photoelectric conversion signal.

(2) Electric Charge Readout Area Pattern in FIG. 8(*b*)

FIG. 8(*b*) presents an example in which first and second photoelectric conversion areas 251 and 252 are formed in the organic photoelectric conversion films 230. In order to read out a photoelectric conversion signal originating in the first and second photoelectric conversion areas 251 and 252, the electrode selection transistor 301 is turned on with a control signal φP1.

As the electrode selection transistor 301 is turned on in response to the control signal φP1 and the electrode selection transistor 302 is turned off in response to a control signal φP2, an electric charge sum of the electric charge generated in the overlapping area where the common electrode 231 overlaps the first partial electrode 232*a* and the electric charge generated in the overlapping area where the common electrode 231 overlaps the second partial electrode 232*b* in the organic photoelectric conversion film 230, as explained earlier, is output to the gate of the output transistor 304. As a result, a photoelectric conversion signal generated based upon the electric charge sum, representing the sum of the electric charges generated in the first and second photoelectric conversion areas 251 and 252, indicated as hatched areas in FIG. 8(*b*), is read out from the terminal Vout. The image processing unit 14 in FIG. 1 generates image data based upon the photoelectric conversion signal thus read out.

It is to be noted that the image data express an image that would be obtained in the case wherein the photographing optical system 10 is adjusted to a predetermined first F number from the maximum aperture F number.

(3) Electric Charge Readout Area Pattern in FIG. 8(*c*)

FIG. 8(*c*) presents an example in which the first photoelectric conversion area 251 is formed in the organic photoelectric conversion film 230. In order to read out a photoelectric conversion signal generated based upon the electric charge provided from the first photoelectric conversion area 251, the electrode selection transistors 301 and 302 are sustained in an off state.

As the electrode selection transistors 301 and 302 both remain in an off state, the electric charge generated in the overlapping area where the common electrode 231 overlaps the first partial electrode 232*a* in the organic photoelectric conversion film 230 is output to the gate of the output transistor 304. As a result, a photoelectric conversion signal generated based upon the electric charge generated in the first photoelectric conversion area 251, indicated as a hatched area in FIG. 8(*c*), is read out from the terminal Vout. The image processing unit 14 in FIG. 1 generates image data based upon the photoelectric conversion signal thus read out.

It is to be noted that the image data express an image that would be obtained in the case wherein the photographing optical system 10 is adjusted to a second F number from the first F number.

Among the image data corresponding to the maximum aperture F number obtained from the photoelectric conversion areas in FIG. 8(a), the image data corresponding to the first F number obtained from the photoelectric conversion areas shown in FIG. 8(b) and the image data corresponding to the second F number obtained from the photoelectric conversion area shown in FIG. 8(c), the image data corresponding to the maximum aperture F number express an image with a relatively small focal depth (depth of field), the image data corresponding to the first F number express an image with an intermediate focal depth (depth of field) in relative terms, and the image data corresponding to the second F number express an image with a relatively large focal depth (depth of field).

On the other hand, as explained earlier, the pixels 220 disposed in the second image sensor unit 22 each include a photoelectric conversion unit 220a that receives a light flux having passed through the entire range of the pupil area formed by selecting the maximum aperture F number in the photographing optical system 10, and the image processing unit 14 shown in FIG. 1 generates image data based upon photoelectric conversion signals read out from the individual pixels 220.

It is to be noted that the light having been transmitted through each of the pixels 210 in the first image sensor unit 21 enters the corresponding pixels 220 in the second image sensor unit 22 in equal amounts, irrespective of the electric charge readout pattern selected for the pixels 210 among the patterns shown in FIGS. 8(a) through 8(c). Therefore, the image data generated based upon the photoelectric conversion signals read out from the pixels 220 in the second image sensor unit 22 express an image obtained by setting the aperture in the photographing optical system 10 to the maximum aperture F number. The image data corresponding to the maximum aperture F number provided by the second image sensor unit 22 express an image with a relatively small focal depth (depth of field).

Next, a method through which image data with varying focal depths (depths of field) are generated in the digital camera 1 through a single photographing operation will be explained. As a large focal depth (depth of field) photographing mode, which is a setting within the multiple focal depth (depth of field) photographing mode, is selected and set based upon the operation unit 13 shown in FIG. 1, the aperture in the photographing optical system 10 is set to the maximum aperture F number and the electrode selection transistors 301 and 302 are both set to an off state. At the first and second image sensor units 21 and 22, photographing operations, i.e. exposure operations, start simultaneously. Photoelectric conversion signals generated based upon electric charges generated in the first photoelectric conversion areas 251 shown in FIG. 8(c) are read out from the pixels 210 in the first image sensor unit 21 and the image processing unit 14 shown in FIG. 1 executes image processing on the photoelectric conversion signals thus read out so as to generate image data expressing an image that would be obtained by setting the aperture to the second F number in the photographing optical system 10. It is to be noted that the image processing unit 14 converts CMY image data to RGB image data through color system conversion processing upon executing image processing on the photoelectric conversion signals provided from the first image sensor unit 21.

While the processing described above is in progress, photoelectric conversion signals provided from the photoelectric conversion units 220a are read out from the individual pixels 220 in the second image sensor unit 22, and the image processing unit 14 shown in FIG. 1 generates, based upon the photoelectric conversion signals thus read out, RGB image data expressing an image that would be obtained in the case wherein the photographing optical system 10 is set to the maximum aperture F number.

The image data corresponding to the second F number and the image data corresponding to the maximum aperture F number are individually brought up on display at the liquid crystal monitor 15 as needed and are also recorded into the memory card 17.

In addition, the image data corresponding to the second F number and the image data corresponding to the maximum aperture F number are combined by the image synthesis unit 12b in FIG. 1, and as a result, a composite image is generated. This composite image is also brought up on display at the liquid crystal monitor 15 as needed and is recorded into the memory card 17.

As explained above, the image data corresponding to the maximum aperture F number have a small focal depth (small depth of field), whereas the image data corresponding to the second F number have a greater focal depth (greater depth of field). This means that the image data corresponding to the maximum aperture F number may express, for instance, an image in which the primary subject in the foreground (close-up range) is in focus, while subjects at an intermediate range and at a far range are out of focus, an image in which a subject at intermediate range is in focus but subjects a far range and at close-up range are out of focus, or an image in which a subject at a far range is in focus but subjects at a close-up range and at intermediate range are out of focus. On the other hand, the image data corresponding to the second F number, on the other hand, express an image in which for instance, subjects at a close-up range, at an intermediate range and at a far range are all in focus.

In addition, the image synthesis unit 12b in FIG. 1 may combine images to generate composite image data by, for instance, extracting image data corresponding to a blurred image of a subject at an intermediate range from image data corresponding to the maximum aperture F number, extracting image data corresponding to in-focus images of subjects at a close-up range and at a far range from image data corresponding to the second F number and combining the extracted image data. In such a case, image data achieving an in-focus state for the images of the subjects at a close-up range and a far range with an intentional blur (bokeh) of the subject at the intermediate range, are obtained. By combining image data corresponding to the maximum aperture F number with a small focal depth and image data corresponding to the second F number with a great focal depth, as described above, composite image data that could not be obtained from a standard photographing optical system can be obtained.

As an intermediate focal depth (depth of field) photographing mode, which is a setting within the multiple focal depth (depth of field) photographing mode, is selected and set based upon the operation unit 13 shown in FIG. 1, the aperture in the photographing optical system 10 is set to the maximum aperture F number, the electrode selection transistor 301 is turned on and the electrode selection transistor 302 is turned off. Photoelectric conversion signals generated based upon electric charges generated in the first and second photoelectric conversion areas 251 and 252 shown in FIG. 8(b) are read out from the pixels 210 in the first image sensor unit 21, and the image processing unit 14 shown in FIG. 1 executes image processing, which includes the color system conversion processing described earlier, on the photoelectric conversion signals thus read out so as to generate RGB image data expressing an image that would be obtained in the case wherein the photographing optical system 10 is set to the first F number.

While the processing described above is in progress, photoelectric conversion signals provided from the photoelectric conversion units 220a are read out from the individual pixels 220 in the second image sensor unit 22, and the image processing unit 14 shown in FIG. 1 generates, based upon the photoelectric conversion signals thus read out, RGB image data expressing an image obtained in the case wherein the photographing optical system 10 is set to the maximum aperture F number.

The image data corresponding to the first F number and the image data corresponding to the maximum aperture F number are individually brought up on display at the liquid crystal monitor 15 as needed and are also recorded into the memory card 17.

In addition, the image data corresponding to the first F number and the image data corresponding to the maximum aperture F number are combined by the image synthesis unit 12b in FIG. 1, and as a result, a composite image is generated. This composite image is also brought up on display at the liquid crystal monitor 15 as needed and is recorded into the memory card 17.

It is to be noted that the image data corresponding to the first F number provided from the first image sensor unit 21 assume an intermediate focal depth (depth of field) in relative terms and thus may express, for instance, an image achieving an in-focus state for images of subjects at a close-up range and an intermediate range while allowing an image of a subject at a far range to be blurred, or an image achieving an in-focus state for images of subjects at an intermediate range and a far range while allowing an image of a subject at a close-up range to be blurred. By combining such image data corresponding to the first F number and image data corresponding to the maximum aperture F number, various composite images that could not be obtained from a standard photographing optical system can be created.

As a small focal depth (depth of field) photographing mode, which is a setting within the multiple focal depth (depth of field) photographing mode, is selected and set based upon the operation unit 13 shown in FIG. 1, the aperture in the photographing optical system 10 is set to the maximum aperture F number, the electrode selection transistors 301 and 302 are both turned on, photoelectric conversion signals generated based upon electric charges generated in the first, second and third photoelectric conversion areas 251, 252 and 253 shown in FIG. 8(a) are read out from the pixels 210 in the first image sensor unit 21, and the image processing unit 14 shown in FIG. 1 executes image processing, which includes the color system conversion processing described earlier, on the photoelectric conversion signals thus read out so as to generate RGB image data expressing an image obtained in the case wherein the photographing optical system 10 is set to the maximum aperture F number.

While the processing described above is in progress, photoelectric conversion signals provided from the photoelectric conversion units 220a are read out from the individual pixels 220 in the second image sensor unit 22, and the image processing unit 14 shown in FIG. 1 generates, based upon the photoelectric conversion signals thus read out, RGB image data expressing an image obtained in the case wherein the photographing optical system 10 is set to the maximum aperture F number.

The image data corresponding to the maximum aperture F number provided from both the first image sensor unit 21 and the second image sensor unit 22 are individually brought up on display at the liquid crystal monitor 15 as needed and are also recorded into the memory card 17.

In addition, the image data corresponding to the maximum aperture F number provided from the first image sensor unit 21 and the image data corresponding to the maximum aperture F number provided from the second image sensor unit 22 are combined by the image synthesis unit 12b shown in FIG. 1, and as a result, a composite image is generated. This composite image is also brought up on display at the liquid crystal monitor 15 as needed and is recorded into the memory card 17.

While the image data provided from the first image sensor unit 21 and the image data provided from the second image sensor unit 22, both corresponding to the maximum aperture F number assume the same focal depth, a high-quality image, for instance, can be generated by combining them through image synthesis.

Figure 9:
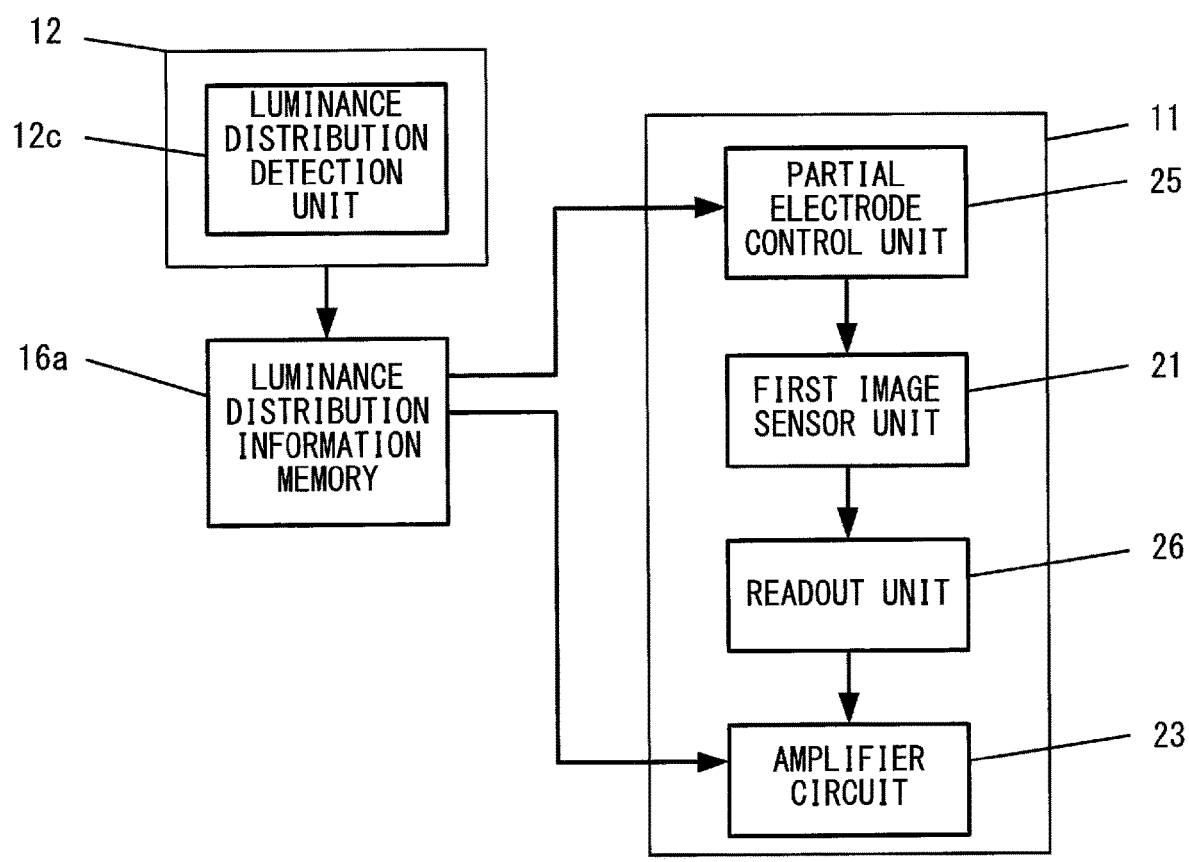

FIG. 9 is a block diagram illustrating the high dynamic range photographing mode. The control unit 12 includes a luminance distribution detection unit 12c in the form of a functional unit. The luminance distribution detection unit 12c detects, for each of individual pixels 220 in the second image sensor unit 22, the subject luminance distribution at the image-capturing surface from a live-view image obtained by repeatedly executing image-capturing operation over predetermined time intervals (e.g., 60 frames/sec) based upon, for instance, the second image sensor unit 22. A luminance information at the individual pixels 220, detected by the luminance distribution detection unit 12b, is also regarded as a luminance information at the individual pixels 210 in the first image sensor unit 21, each having a corresponding relation to one of the pixels 220 in the second image sensor unit 22, and is stored in correlation to information at the positions of the individual pixels 210, into a luminance distribution information memory 16a, which is part of the storage area in the buffer memory 16.

A partial electrode control unit 25 in the image-capturing unit 11 controls on/off states of the electrode selection transistors 301 and 302 in the individual pixels 210 based upon the luminance information corresponding to the individual pixels 210, which is stored in the luminance distribution information memory 16a. If the luminance level stored in correlation to a given pixel 210 is relatively low and is equal to or lower than a first predetermined luminance level, the partial electrode control unit 25 executes control so as to turn on the electrode selection transistors 301 and 302 for the particular pixel 210 and thus forms the first, second and third photoelectric conversion areas 251, 252 and 253 shown in FIG. 8(a). In addition, if the luminance level stored in correlation to a given pixel 210 is relatively high and is higher than a second predetermined luminance level, the partial electrode control unit 25 executes control so as to turn off the electrode selection transistors 301 and 302 for the particular pixel 210 and thus forms the first photoelectric conversion area 251 shown in FIG. 8(c). Furthermore, if the luminance level stored in correlation to a given pixel 210 is intermediate in relative terms and is higher than the first predetermined luminance level and equal to or lower than the second predetermined luminance level, the partial electrode control unit 25 executes control so as to turn on the electrode selection transistor 301 and turn off the electrode selection transistor 302 for the particular pixel 210 and thus forms the first and second photoelectric conversion areas 251 and 252 shown in FIG. 8(*b*).

A readout unit 26 reads out the photoelectric conversion signals from each of the pixels 210 in the first image sensor unit 21, and the amplifier circuit 23 amplifies the photoelectric conversion signals having been read out, each at an amplification factor determined based upon the luminance information corresponding to the originating pixel 210, which is stored in the luminance distribution information memory 16*a*. That is, the photoelectric conversion signals read out by the readout unit 26 are output to the amplifier circuit 23 in sequence in correspondence to the individual pixels 210 and are out put after being amplified by the amplifier circuit 23 at a predetermined amplification factor. In more specific terms, as the photoelectric conversion signals are output from the readout unit 26 in sequence in correspondence to the individual pixels 210, the amplifier circuit 23 amplifies the photoelectric conversion signal from each pixel 210 at the amplification factor set based upon the luminance information pertaining to the particular pixel 210 stored in the luminance distribution information memory 16*a*. The amplification factor corresponding to each pixel 210, at which the amplifier circuit 23 amplifies the photoelectric conversion signal from the particular pixel 210, will be explained in detail below.

In order to simplify the explanation, a pixel 210 achieving a luminance level equal to or lower than the first predetermined luminance level will be referred to as a low luminance pixel, a pixel 210 achieving a luminance level higher than the first predetermined luminance level and equal to or lower than the second predetermined luminance level will be referred to as an intermediate luminance pixel, and a pixel 210 achieving a luminance level higher than the second predetermined luminance level will be referred to as a high luminance area pixel. If a photoelectric conversion signal having been read out by the readout unit 26 originates from a low luminance pixel, the amplifier circuit 23 amplifies the photoelectric conversion signal at a first amplification factor, if a photoelectric conversion signal having been read out by the readout unit 26 originates from an intermediate luminance pixel, the amplifier circuit 23 amplifies the photoelectric conversion signal at a second amplification factor greater than the first amplification factor, and if a photoelectric conversion signal having been read out by the readout unit 26 originates from a high luminance pixel, the amplifier circuit 23 amplifies the photoelectric conversion signal at a third amplification factor greater than the second amplification factor. Under these circumstances, the amplifier circuit 23 functions as a correction unit that corrects each photoelectric conversion signal in correspondence to the luminance level.

As described above, for a low luminance pixel, a photoelectric conversion signal resulting from photoelectric conversion in the first, second and third photoelectric conversion areas 251, 252 and 253 together achieving a relatively large area, is amplified at a relatively small amplification factor, for a high luminance pixel, a photoelectric conversion signal resulting from photoelectric conversion in the first photoelectric conversion area 251 with a relatively small area, is amplified at a relatively large amplification factor, and for an intermediate luminance pixel, a photoelectric conversion signal resulting from photoelectric conversion in the first and second photoelectric conversion areas 251 and 252 together achieving an intermediate size area in relative terms, is amplified at an intermediate amplification factor in relative terms. Through these measures, photoelectric conversion signals can be obtained over a wide dynamic range from high luminance through low luminance.

It is to be noted that in the example described above, the second image sensor unit 22 detects the luminance of the photographic subject in correspondence to each pixel 220, and generates luminance distribution information, whereas the partial electrode control unit 25 makes an area selection from the first, second and third photoelectric areas 251, 252 and 253 for each pixel 210 in the first image sensor unit 21 based upon the luminance distribution information. As an alternative, the second image sensor unit 22 may detect an average luminance value or a representative luminance value pertaining to a specific area at the image-capturing surface and store luminance value information into the luminance distribution information memory 16*a* in correlation to the particular area. In this case, the partial electrode control unit 25 may make an area selection from the first, second and third photoelectric conversion areas 251, 252 and 253 for the plurality of pixels 210 in the first image sensor unit 21, which correspond to the specific area.

In addition, the photographic subject luminance distribution may be detected by the first image sensor unit 21 or by another photometric sensor instead of by the second image sensor unit 22. In case the detection of the subject luminance distribution is detected by the first image sensor unit 21, The first image sensor unit 21 may be engaged in photographic subject luminance distribution detection by setting all the pixels 210 in the first image sensor unit 21 in one of the states shown in FIGS. 8(*a*) through 8(*c*). Once the photographic subject luminance distribution is detected, the partial electrode control unit 25 will execute control so as to make an optimal selection from the partial electrodes 232*a*, 232*b* and 232*c* in each pixel 210 in correspondence to the photographic subject luminance distribution having been detected as described earlier.

The present embodiment allows for the following variations.

(1) While three partial electrodes 232*a* through 232*c* are disposed in a concentric pattern at each pixel 210 in the first embodiment described above, two partial electrodes or four or more partial electrodes may be disposed in the pixel 210. By increasing the number of partial electrodes, a greater number of sets of image data corresponding to varying depths of field can be obtained and image data achieving an even greater dynamic range can be obtained.

Figure 10:
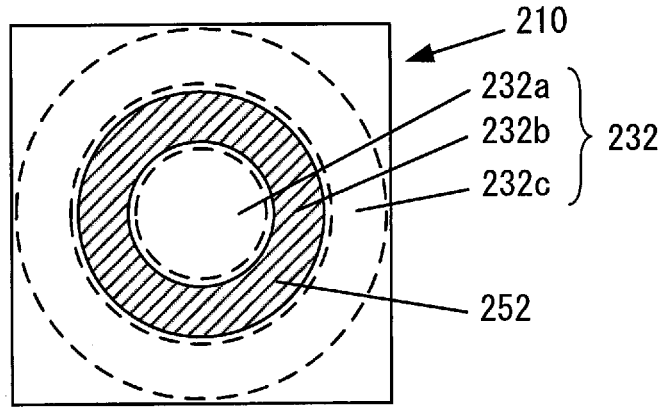
Figure 10:
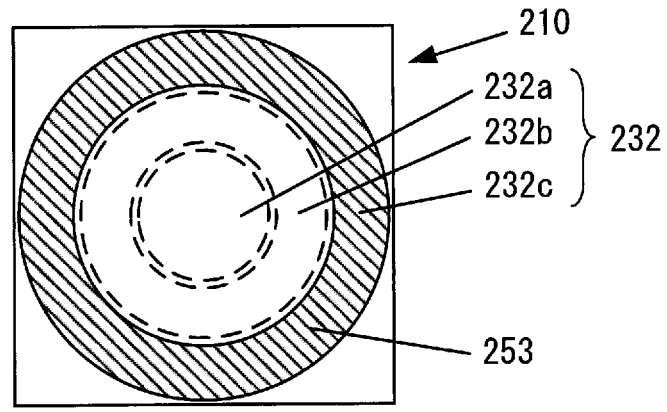
Figure 10:
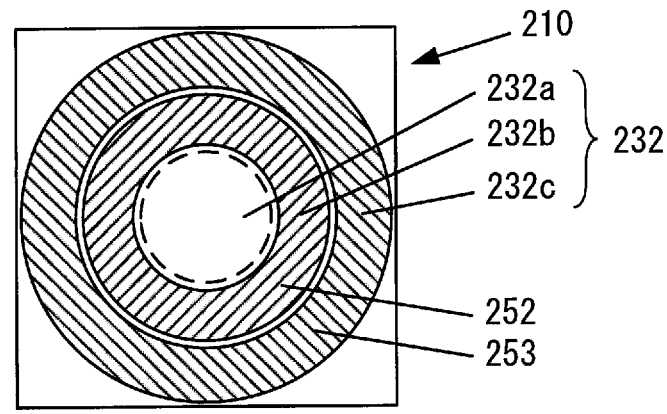

(2) Electric charge readout area patterns that may be set in a pixel 210 are not limited to those shown in FIGS. 8(*a*) through 8(*c*). For instance, only a photoelectric conversion signal generated based upon the electric charge generated in the hatched second photoelectric conversion area 252 shown in FIG. 10(*a*) may be read out, only a photoelectric conversion signal generated based upon the electric charges generated in the hatched third photoelectric conversion area 253 shown in FIG. 10(*b*) may be read out, and only a photoelectric conversion signal generated based upon the electric charges generated in the hatched second and third photoelectric conversion areas 252 and 253 shown in FIG. 10(*c*) may be read out. Photoelectric conversion areas 252 and 253 such as those shown in FIGS. 10(*a*) through 10(*c*) can be formed by disposing an electrode selection transistor similar to the electrode selection transistors 301 and 302 at a position between the partial electrode 232*a* and the gate of the output transistor 304.

Figure 11:
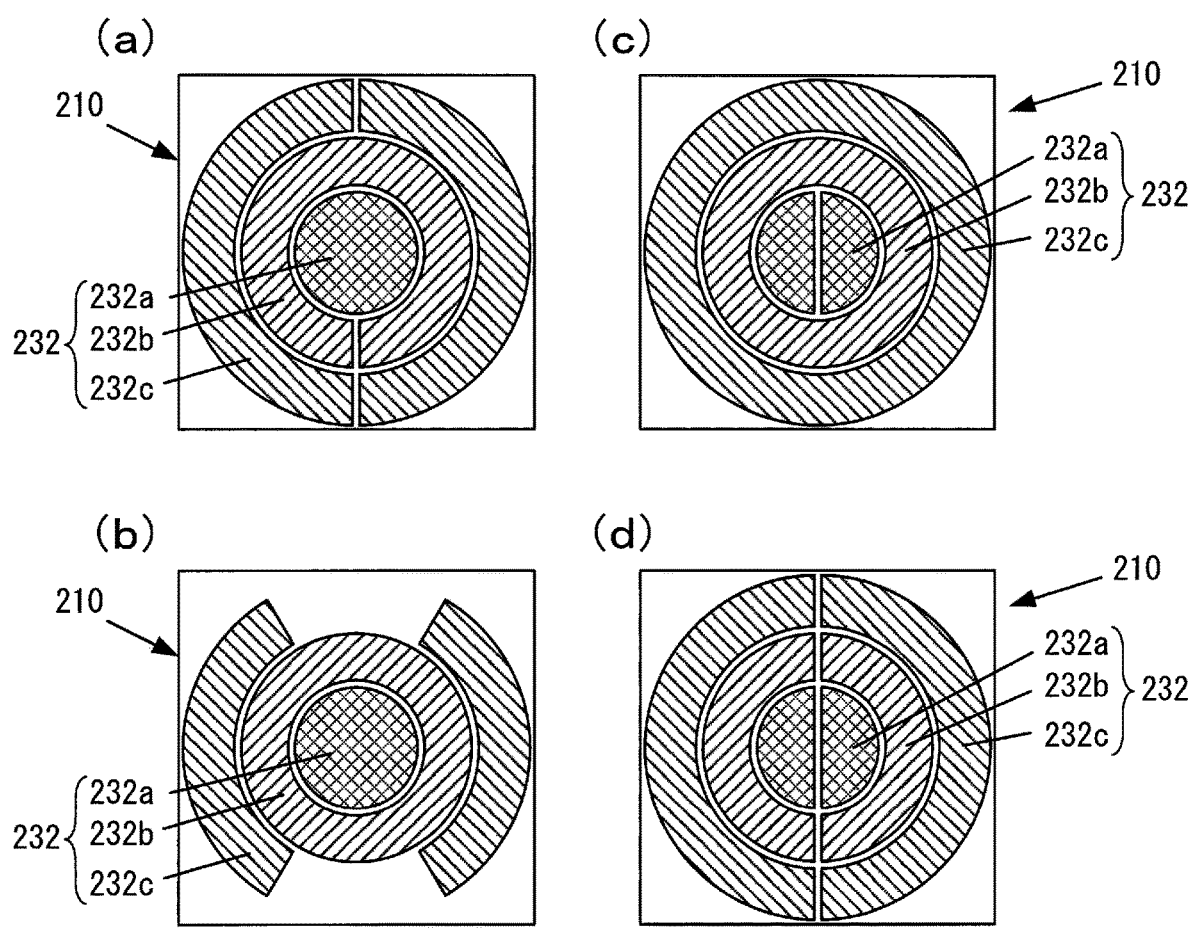

(3) While an outer partial electrode is an annular electrode achieving a closed-loop shape surrounding the inner partial electrode along its entire circumference in the description provided earlier, it is not strictly necessary for the outer partial electrode to surround the inner partial electrode along its entire circumference. For instance, a partial electrode may be formed as a discontinuous electrode with a gap disrupting its continuity along the circumferential direction, as is a second partial electrode 232b shown in FIG. 11(a), or a partial electrode may be divided into portions along the circumferential direction, as is a third partial electrode 232c shown in FIG. 11(a). It is to be noted that a partial electrode may be divided into three or more portions along the circumferential direction. Namely, an outer partial electrode does not need to surround the inner partial electrode along the entire circumference thereof, as long as it is present around the inner partial electrode, as are the second and third partial electrodes 232b and 232c in FIG. 11(a) are. In addition, in a state in which "an outer partial electrode is present around the inner partial electrode", two outer partial electrodes, one on the left side and the other on the right, disposed so as to range along the outer circumference of the inner partial electrode, may be set apart from each other over a significant distance, as are third partial electrodes 232c shown in FIG. 11(b).

(4) The first partial electrode 232a may be formed as two separate electrodes, as shown in FIG. 11(c). Furthermore, the first through third partial electrodes 232a through 232c may each be split into two portions, as shown in FIG. 11(d). In addition, while the first partial electrode 232a is formed in a circular shape and the second and third partial electrodes are formed in an annular shape, the first partial electrode 232a may instead be formed in an elliptical shape and the second and third partial electrodes may each be formed in the shape of an ellipsoidal annulus. Moreover, the first partial electrode 232a may be formed in a polygonal shape and the second and third partial electrodes may each be formed in the shape of a polygonal annulus.

(5) In the first embodiment described above, while electric charges generated in the first through third photoelectric conversion areas 251 through 253 are read out from the first through third partial electrodes 232a through 232c, they may instead be read out from the common electrode 231. In other words, the common electrode 231 may be connected to the gate of the output transistor 304, the first partial electrode 232a may be directly connected to the ground or connected to the ground through the electrode selection transistor 301, the second partial electrode 232b may be connected to the ground through the electrode selection transistor 301 and the third partial electrode 232c may be connected to the ground through the electrode selection transistor 302.

(6) In the first embodiment described above, the electric charges generated in the first through third photoelectric conversion areas 251 through 253, read out from the first through third partial electrodes 232a through 232c, are added together and a photoelectric conversion signal generated based upon the electric charge sum is output from the output terminal Vout based upon the output transistor 304 and the row selection transistor 305. As an alternative, the electric charges generated in the first through third photoelectric conversion areas 251 through 253, read out from the first through third partial electrodes 232a through 232c, may be independently read out in time sequence and the electric charges may then be added together.

(7) In the embodiment described above, the common electrode 231 constitutes the upper electrode layer while the lower electrode layer is constituted with the first through third partial electrodes 232a, 232b and 232c in the first image sensor unit 21. As an alternative, the upper electrode layer, too, may be constituted with a plurality of partial electrodes, as is the lower electrode layer.

(8) In the embodiment described above, while a CMY image is obtained from the first image sensor unit 21 and an RGB image is obtained from the second image sensor unit 22, an RGB image may be obtained from the first image sensor unit 21 and a CMY image may be obtained from the second image sensor unit 22, instead.

The following advantageous effects are achieved through the first embodiment described above.

(1) The pixels 210 are each formed so as to include a photoelectric conversion layer, i.e., an organic photoelectric conversion film 230, a first partial electrode 232a disposed on one side of a surface of the organic photoelectric conversion film 230, and a second partial electrode 232b formed so as to surround the first partial electrode 232a. As a result, a plurality of types of photoelectric conversion signals can be read out from a single pixel 210 by making an optimal selection from the first partial electrode and the second partial electrode.

(2) The pixels 210 are formed so that the second partial electrode 232b surrounds the first partial electrode 232a along the entire circumference thereof and that the third partial electrode 232c surrounds the second partial electrode 232b along the entire circumference thereof. In addition, the first through third partial electrodes 232a through 232c are disposed in a concentric pattern. As a result, an aesthetically effective blur is achieved i.e., effective bokeh is achieved in the image obtained through the image-capturing operation executed in the first image sensor unit 21, which is bound to contribute an overall improvement in the image quality.

(3) The second image sensor unit 22 is disposed so as to receive light having been transmitted through the first image sensor unit 21. This means that two sets of image data pertaining to a single photographic subject can be obtained simultaneously based upon the first and second image sensor units 21 and 22, assuring a wider range of image data utilization and greater convenience.

(4) The pixels 220 in the second image sensor unit 22 each include a photoelectric conversion unit 220a that receives a light flux having passed through the entire range of the pupil area formed by selecting the maximum aperture F number in the photographing optical system 10. Through these measures, incident light undergoes photoelectric conversion with better efficiency, which, in turn, improves the sensitivity at the second image sensor unit 22. As a result, a subject image can be captured even when the amount of light from the subject is limited.

(5) It is available that two sets of image data with different depths of field are obtained simultaneously based upon the first image sensor unit 21 and the second image sensor unit 22 by setting the electric charge readout area in each pixel 210 to the optimal size. This allows, for instance, a set of image data containing image areas with different depths of field to be generated by using the two sets of image data with depths of field different from each other, as described above, and as a result, a wider range of image data utilization is made possible, to assure an improvement in convenience.

(6) The digital camera 1 is configured so as to enable it to obtain image data generated by replacing the image in an area of an image expressed by first image data with the image in an area corresponding to the area in the first image data, which is part of an image expressed by second image data assuming a depth of field different from the depth of field assumed in the first image data. As a result, more diverse image expression is enabled.

(7) The structure adopted in the embodiment allows the subject luminance distribution at the image-capturing surface to be detected and the size of an area formed by combining the photoelectric conversion areas 251, 252 and 253 in each pixel 210, to be adjusted in correspondence to the detected luminance distribution. As a result, the extent of over-exposure (white-clipping) or under-exposure (black-clipping) in the image obtained through image-capturing operation can be minimized and ultimately, better image quality is assured. In addition, the structure allows the amplifier circuit 23 to adjust the amplification factor depending upon the luminance level of the originating pixel, i.e., the photoelectric conversion signal having been read out by the readout unit 26 is a signal from a low luminance pixel, a signal from an intermediate luminance pixel or a signal from a high luminance pixel. Namely, photoelectric conversion signals are each corrected by the amplifier circuit 23 in correspondence to information indicating the luminance level at the corresponding pixel 210 detected by the luminance distribution detection unit 12b. As a result, an image achieving a wider dynamic range is obtained.

—Second Embodiment—

In reference to FIGS. 12 through 22, the second embodiment will be described. The following explanation focuses on features distinguishing the second embodiment from the first embodiment with the same reference signs assigned to structural elements identical to those in the first embodiment. Aspects that are not specifically noted should be assumed to be identical to those in the first embodiment. In this embodiment, the resolution of an image obtained through image-capturing operation is improved through the following process.

Figure 12:
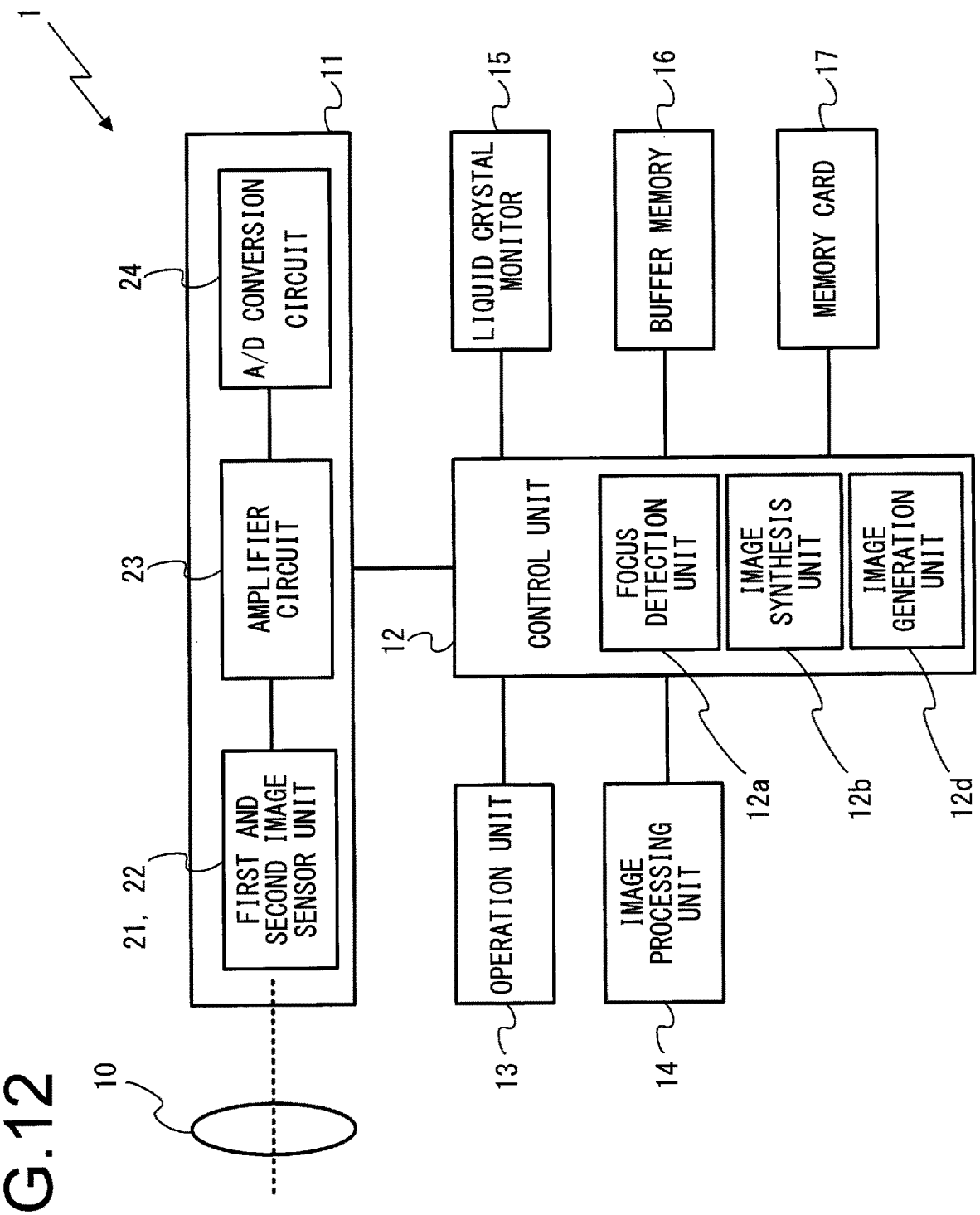

FIG. 12 presents an example of a structure that may be adopted in the digital camera 1 according to the second embodiment. The digital camera 1 according to the second embodiment is structurally distinguishable from the digital camera 1 in the first embodiment shown in FIG. 1 in that the control unit 12 further includes an image generation unit 12d in the form of a functional unit and in that it includes first and second image sensor units 21 and 22 structurally and functionally distinguishable from those in the first embodiment. The image generation unit 12d generates image signals by using the photoelectric conversion signals provided from the first and second image sensor units 21 and 22 stored in the buffer memory 16. It is to be noted that the first and second image sensor units 21 and 22 start executing image-capturing operations (exposure operations) simultaneously, as in the first embodiment.

Figure 13:
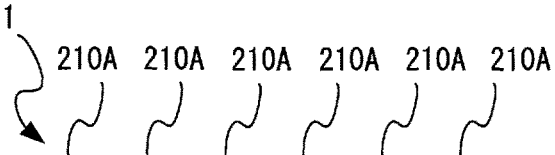
Figure 13:
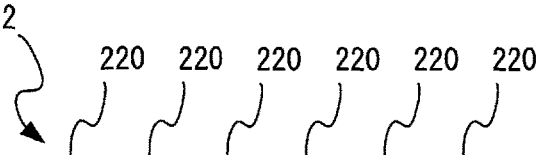

FIG. 13 is a diagram individually indicating the positional arrangement of pixels 210 in 10 rows×6 columns at part of the first image sensor unit 21 and the positional arrangement of pixels 220 in 10 rows×6 columns at part of the second image sensor unit 22 in the present embodiment. In the present embodiment, while an RGB image is obtained from the first image sensor unit 21 and a CMY image is obtained from the second image sensor unit 22, unlike in the first embodiment, in the description of the present embodiment for purposes of simplification, a CMY image may instead be obtained from the first image sensor unit 21 and an RGB image may be obtained from the second image sensor unit 22, as in the first embodiment.

In the first image sensor unit 21 in FIG. 13(a), each pixel 210A marked "G" is a pixel at which light with a green color component is absorbed and undergoes photoelectric conversion, i.e., a pixel having green spectral sensitivity. Likewise, each pixel 210A marked "B" is a pixel at which light with a blue color component is absorbed and undergoes photoelectric conversion, i.e., a pixel having blue spectral sensitivity, and each pixel 210A marked "R" is a pixel at which light with a red color component is absorbed and undergoes photoelectric conversion, i.e., a pixel having red spectral sensitivity. In the first image sensor unit 21, the columnar pixel positions in each odd-numbered row are alternately taken up by a "G" pixel 210A and a "B" pixel 210A and the columnar pixel positions in each even-numbered row are alternately taken up by an "R" pixel 210A and a "G" pixel 210A. Namely, the pixels are disposed in a Bayer array at the first image sensor unit 21.

While the second image sensor unit 22 in the second embodiment adopts a structure identical to that of the second image sensor unit 22 in the first embodiment, the "R", "G" and "B" pixels 210A in the first image sensor unit 21 act as color filters for the second image sensor unit 22 and thus, the second image sensor unit 22 in the second embodiment assumes cyan spectral sensitivity, magenta spectral sensitivity and yellow spectral sensitivity. This feature will be described in detail below.

In the second image sensor unit 22 in FIG. 13(b), each pixel 220 marked "Mg" is a pixel at which light with a magenta color component is absorbed and undergoes photoelectric conversion, i.e., a pixel having magenta spectral sensitivity. Likewise, each pixel 220 marked "Ye" is a pixel at which light with a yellow color component is absorbed and undergoes photoelectric conversion, i.e., a pixel having yellow spectral sensitivity, and each pixel 220 marked "Cy" is a pixel at which light with a cyan color component is absorbed and undergoes photoelectric conversion, i.e., a pixel having cyan spectral sensitivity. In the second image sensor unit 22, the columnar pixel positions in each odd-numbered row are alternately taken up by an "Mg" pixel 220 and a "Ye" pixel 220 and the columnar pixel positions in each even-numbered row are alternately taken up by a "Cy" pixel 220 and an "Mg" pixel 220.

In FIGS. 13(a) and 13(b), the "G" pixels 210A in the first image sensor unit 21 each correspond to one of the "Mg" pixels 220 in the second image sensor unit 22, the "B" pixels 210A in the first image sensor unit 21 each correspond to one of the "Ye" pixels 220 in the second image sensor 22, and the "R" pixels 210A in the first image sensor unit 21 each correspond to one of the "Cy" pixels 220 in the second image sensor unit 22.

FIGS. 14(a) and 14(b) schematically illustrate the structure of the pixels 210A in the first image sensor unit 21. FIG. 14(a) shows a plan view of a pixel 210A in the image sensor unit 21 from the subject side, FIG. 14(b) is a side elevation of the pixel 210A and FIG. 14(c) shows the positional arrangement with which first through fourth partial electrodes are disposed, viewed from the subject side. The pixels 210A in the first image sensor 201 each include an organic photoelectric conversion film 230 that absorbs light with the green color component, the blue color component or the red color component, a transparent common electrode 231 formed at the upper surface of the organic photoelectric conversion film 230, i.e., at the surface of the organic photoelectric conversion film 230 located toward the subject, and transparent first through fourth partial electrodes 234a, 234b, 234c and 234d formed at the lower surface of the organic photoelectric conversion film 230.

The first through fourth partial electrodes 234a, 234b, 234c and 234d, formed as rectangles of the same size, are disposed along a row direction in which rows extend and along a column direction in which columns extend, in a 2×2 pattern. In FIG. 14(c), the upper left partial electrode is the first partial electrode 234a, the lower left partial electrode is the second partial electrode 234b, the upper right partial electrode is the third partial electrode 234c and the lower right partial electrode is the fourth partial electrode 234d.

Figure 15:
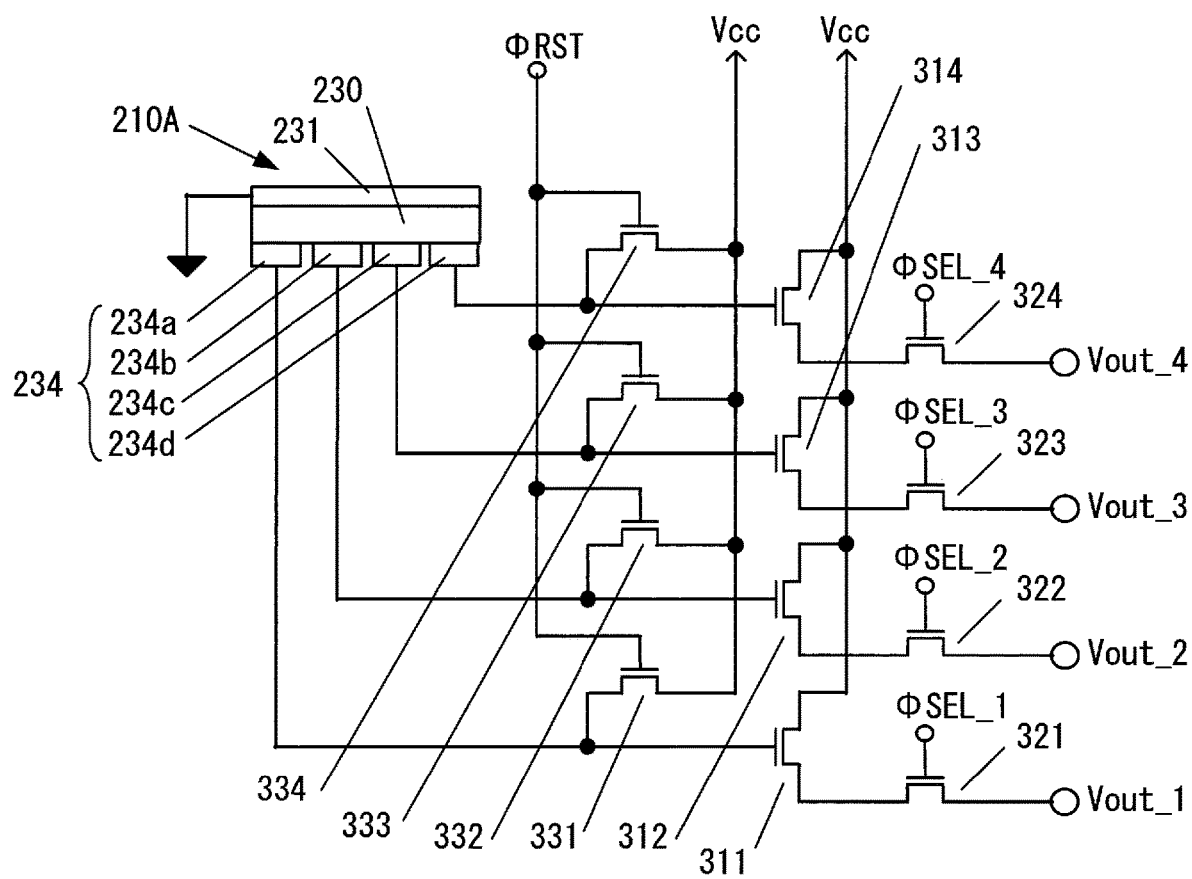

FIG. 15 is a diagram presenting an example of a circuit structure that may be adopted in the signal readout circuit for a pixel 210A in the first image sensor unit 21. The signal readout circuit for each pixel 210A includes output transistors 331 through 334, row selection transistors 321 through 324 and reset transistors 331 through 334. The common electrode 231 is connected to the ground. The first partial electrode 234a is connected to the gate of the output transistor 311, the second partial electrode 234b is connected to the gate of the output transistor 312, the third partial electrode 234c is connected to the gate of the output transistor 313 and the fourth partial electrode 234d is connected to the gate of the output transistor 314.

The output transistor 311 amplifies a voltage signal generated based upon an electric charge provided from the first partial electrode 234a, the output transistor 312 amplifies a voltage signal generated based upon an electric charge provided from the second partial electrode 234b, the output transistor 313 amplifies a voltage signal generated based upon an electric charge provided from the third partial electrode 234c, and the output transistor 314 amplifies a voltage signal generated based upon an electric charge provided from the fourth partial electrode 234d.

The signal amplified by the output transistor 311 is read out, via the row selection transistor 321, from a terminal Vout_1, the signal amplified by the output transistor 312 is read out, via the row selection transistor 322, from a terminal Vout_2, the signal amplified by the output transistor 313 is read out, via the row selection transistor 323, from a terminal Vout_3, and the signal amplified by the output transistor 314 is read out, via the row selection transistor 324, from a terminal Vout_4. The reset transistors 331 through 334 allow excess electric charge to be discharged in response to a reset signal φRST.

—Area Through which an Electric Charge is Read Out from a Pixel 210A—

Figure 16:
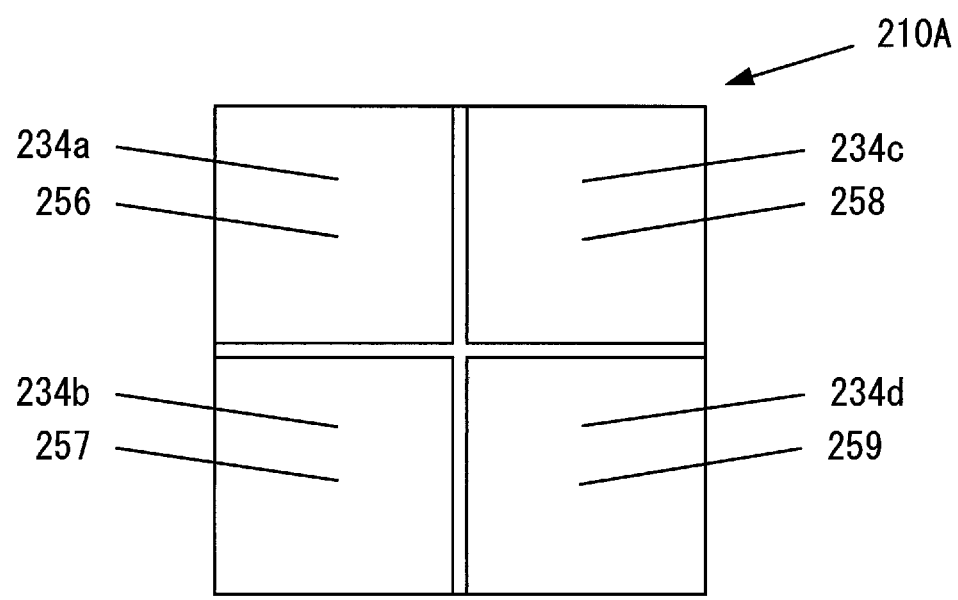

In the first image sensor unit 21 according to the present embodiment, a photoelectric conversion area through which an electric charge generated in the organic photoelectric conversion film 230 can be read out is located in a region where the common electrode 231 overlaps a partial electrode to be used for purposes of readout within the range covered by the common electrode 231 on one side and by the first through fourth partial electrodes 234a through 234d on the other side. As shown in FIG. 16, a first photoelectric conversion area 256 corresponds to the area of the organic photoelectric conversion film 230 covered by the first partial electrode 234a, a second photoelectric conversion area 257 corresponds to the area of the organic photoelectric conversion film 230 covered by the second partial electrode 234b, a third photoelectric conversion area 258 corresponds to the area of the organic photoelectric conversion film 230 covered by the third partial electrode 234c, and a third photoelectric conversion area 259 corresponds to the area of the organic photoelectric conversion film 230 covered by the fourth partial electrode 234d.

The reset transistors 331 through 334 are turned on simultaneously in response to the reset signal φRST to discharge electric charges from the first through fourth photoelectric conversion areas 256, 257, 258 and 259, i.e., the first through fourth photoelectric conversion areas 256, 257, 258 and 259 are reset. Once a predetermined exposure time has elapsed following the reset, the row selection transistors 321, 322, 323 and 324 are all turned on simultaneously in response to row selection signals φSEL_1, φSEL_2, φSEL_3 and φSEL_4 and, as a result, photoelectric conversion signals generated based upon electric charges generated in the first through fourth photoelectric conversion areas 256, 257, 258 and 259 are individually read out from the terminal Vout_1.

—Pixel Signal Generation—

The image generation unit 12d generates a first pixel signal by adding together photoelectric conversion signals from the first through fourth photoelectric conversion areas 256 through 259 in each pixel 210A. Through this process, a green pixel signal at the center of a "G" pixel 210A, i.e., at the gravitational center of the "G" pixel 210A, for instance, is obtained as the first pixel signal from the particular "G" pixel 210A. Likewise, a blue pixel signal at the gravitational center position of a "B" pixel 210A is obtained as the first pixel signal from the "B" pixel 210A, and a red pixel signal at the gravitational center position of an "R" pixel 210A is obtained as the first pixel signal from the "R" pixel 210A.

In addition, the image generation unit 12d obtains a second pixel signal from each pixel 220 in the second image sensor unit 22. Namely, the image generation unit 12d obtains a magenta pixel signal at the central position in each "Mg" pixel 220, i.e., at the gravitational center of the particular "Mg" pixel 220, as the second pixel signal of the "Mg" pixel 220. Likewise, the image generation unit 12d obtains a yellow pixel signal at the gravitational center position of each "Ye" pixel 220 as the second pixel signal from the "Ye" pixel 220. The image generation unit 12d obtains a cyan pixel signal at the gravitational center position of each "Cy" pixel 220 as the second pixel signal from the "Cy" pixel 220.

—Virtual Pixel Signals—

Furthermore, as explained below, the control unit 12 sets a virtual pixel at an intermediate portion between two pixels 210A disposed next to each other along the row direction or the column direction in the first image sensor unit 21. In FIGS. 17 through 20, show the positional arrangement of pixels 210A of 5 rows×6 columns at part of the first image sensor unit 21, the left/right direction in FIGS. 17 through 20 is row direction, a first row, a second row . . . and an m-th row are set starting from the top, whereas, the up/down direction in FIGS. 17 through 20 is column direction, a first column, second column . . . and an n-th column are set starting on the left side.

(1) Yellow Virtual Pixels

Figure 17:
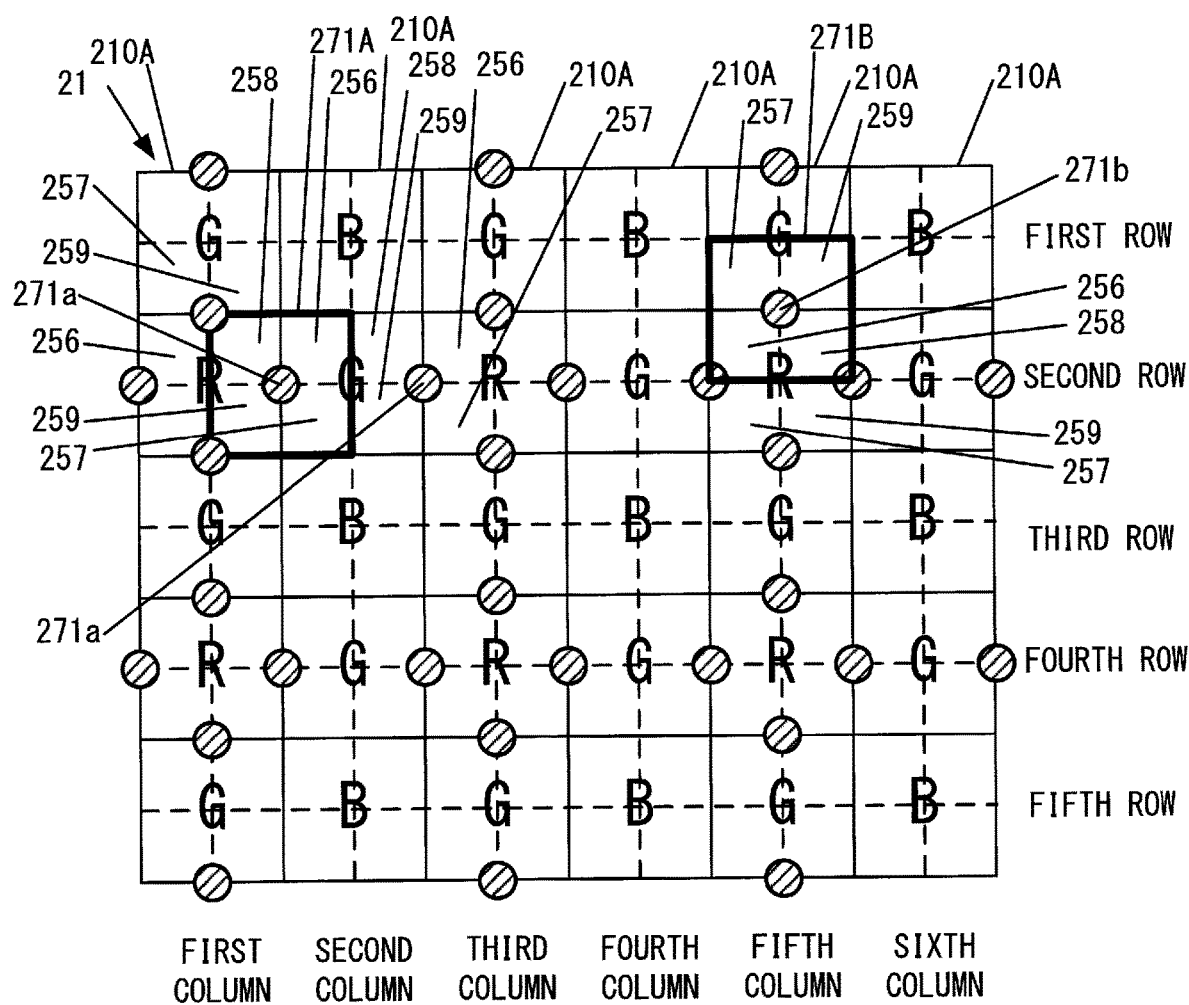

The control unit 12 sets yellow virtual pixels each at an intermediate portion between an "R" pixel 210A and a "G" pixel 210A disposed next to each other along the row direction or the column direction. FIG. 17 shows yellow virtual pixels 271A each arranged at the intermediate portion between an "R" pixel 210A and a "G" pixel 210A disposed next to each other along the row direction, i.e., the left/right direction, together with gravitational center positions 271a of the yellow virtual pixels 271A, and also shows yellow virtual pixels 271B each arranged at the intermediate portion between an "R" pixel 210A and a "G" pixel 210A disposed next to each other along the column direction, i.e., the up/down direction, together with gravitational center positions 271b of the yellow virtual pixels 271B.

The yellow virtual pixels 271A are each constituted with the third and fourth photoelectric conversion areas 258 and 259 of an "R" pixel 210A and the first and second photoelectric conversion areas 256 and 257 in the "G" pixel 210A disposed next to the "R" pixel 210A along the row direction, or with the third and fourth photoelectric conversion areas 258 and 259 of a "G" pixel 210A and the first and second photoelectric conversion areas 256 and 257 in the "R" pixel 210A disposed next to the "G" pixel 210A along the row direction.

In addition, the yellow virtual pixels 271B are each constituted with the second and fourth photoelectric conversion areas 257 and 259 in a "G" pixel 210A and the first and third photoelectric conversion areas 256 and 258 in the "R" pixel 210A disposed next to the "G" pixel 210A along the column direction, or with the second and fourth photoelectric conversion areas 257 and 259 in an "R" pixel 210A and the first and third photoelectric conversion areas 256 and 258 in the "G" pixel 210A disposed next to the "R" pixel 210A along the column direction.

First, the yellow virtual pixels 271A each positioned at the intermediate portion between an "R" pixel 210A and a "G" pixel 210A disposed next to each other along the row direction will be explained. The image generation unit 12c generates a sum pixel signal by adding together, for instance, the photoelectric conversion signals obtained from the third and fourth photoelectric conversion areas 258 and 259 in the "R" pixel 210A disposed at the second row/first column position in FIG. 17 and the photoelectric conversion signals obtained from the first and second photoelectric conversion areas 256 and 257 in the "G" pixel 210A disposed at the second row/second column position next to the "R" pixel 210A.

This sum pixel signal, generated by adding together the photoelectric conversion signals related to light in the red (R) wavelength range, provided from the third and fourth photoelectric conversion areas 258 and 259 in the "R" pixel 210A, and the photoelectric conversion signals related to light in the green (G) wavelength range, provided from the first and second photoelectric conversion areas 256 and 257 in the "G" pixel 210A, is equivalent to a pixel signal from a virtual pixel 271A corresponding to yellow (Ye), which is constituted with the third and fourth photoelectric conversion areas 258 and 259 in the "R" pixel 210A and the first and second photoelectric conversion areas 256 and 257 in the "G" pixel 210A.

The yellow (Ye) virtual pixel 271A is offset both from the "R" pixel 210A and from the "G" pixel 210A by a half pitch and the gravitational center position 271a of the virtual pixel 271A is positioned at the boundary area of the "R" pixel 210A and the "G" pixel 210A.

Likewise, the image generation unit 12d generates a sum pixel signal by adding together the photoelectric conversion signals provided from the third and fourth photoelectric conversion areas 258 and 259 in the "G" pixel 210A disposed at the second row/second column position and the photoelectric conversion signals provided from the first and second photoelectric conversion areas 256 and 257 in the "R" pixel 210A disposed at the second row/third column position. Sum pixel signals are generated in this manner in correspondence to all the pairs of "G" pixels 210A and "R" pixels 210A disposed next to each other along the row direction over the first through m-th rows.

Thus, yellow (Ye) virtual pixels 271A, each positioned at the intermediate portion between a "G" pixel 210A and an "R" pixel 210A disposed next to each other along the row direction, are formed, as shown in FIG. 17, over the entire image-capturing surface of the first image sensor unit 21.

Next, the yellow virtual pixels 271B each positioned at the intermediate portion between an "R" pixel 210A and a "G" pixel 210A disposed next to each other along the column direction, i.e., up/down direction, will be explained.

The image generation unit 12c generates a sum pixel signal by adding together, for instance, the photoelectric conversion signals obtained from the second and fourth photoelectric conversion areas 257 and 259 in the "G" pixel 210A disposed at the first row/fifth column position in FIG. 17 and the photoelectric conversion signals obtained from the first and third photoelectric conversion areas 256 and 258 in the "R" pixel 210A disposed at the second row/fifth column position next to the "R" pixel 210A along the column direction.

This sum pixel signal, generated by adding together the photoelectric conversion signals related to light in the green (G) wavelength range, provided from the second and fourth photoelectric conversion areas 257 and 259 in the "G" pixel 210A, and the photoelectric conversion signals related to light in the red (R) wavelength range, provided from the first and third photoelectric conversion areas 256 and 258 in the "R" pixel 210A, is equivalent to a pixel signal from a virtual pixel 271B corresponding to yellow (Ye), which is constituted with the second and fourth photoelectric conversion areas 257 and 259 in the "G" pixel 210A and the first and third photoelectric conversion areas 256 and 258 in the "R" pixel 210A.

The yellow (Ye) virtual pixel 271B is offset both from the "G" pixel 210A and from the "R" pixel 210A, which are disposed next to each other along the column direction, by a half pitch and the gravitational center position 271b of the virtual pixel 271B is positioned at the boundary area of the "G" pixel 210A and the "R" pixel 210A.

Likewise, the image generation unit 12d generates a sum pixel signal by adding together the photoelectric conversion signals provided from the second and fourth photoelectric conversion areas 257 and 259 in the "R" pixel 210A disposed at the second row/fifth column position and the photoelectric conversion signals provided from the first and third photoelectric conversion areas 256 and 258 in the "G" pixel 210A disposed at the third row/fifth column position. Sum pixel signals are generated in this manner in correspondence to all the pairs of "G" pixels 210A and "R" pixels 210A disposed next to each other along the column direction over the first through n-th columns.

Thus, yellow (Ye) virtual pixels 271B, each positioned at the intermediate portion between a "G" pixel 210A and an "R" pixel 210A disposed next to each other along the column direction, are formed as shown in FIG. 17 over the entire image-capturing surface of the first image sensor unit 21.

As described above, virtual pixel signals corresponding to yellow are obtained through yellow virtual pixels 271A and 271B, set over the entire image-capturing surface of the first image sensor unit 21, each positioned at the intermediate portion between an "R" pixel 210A and a "G" pixel 210A disposed next to each other along the row direction or the column direction.

(2) Cyan Virtual Pixels

Figure 18:
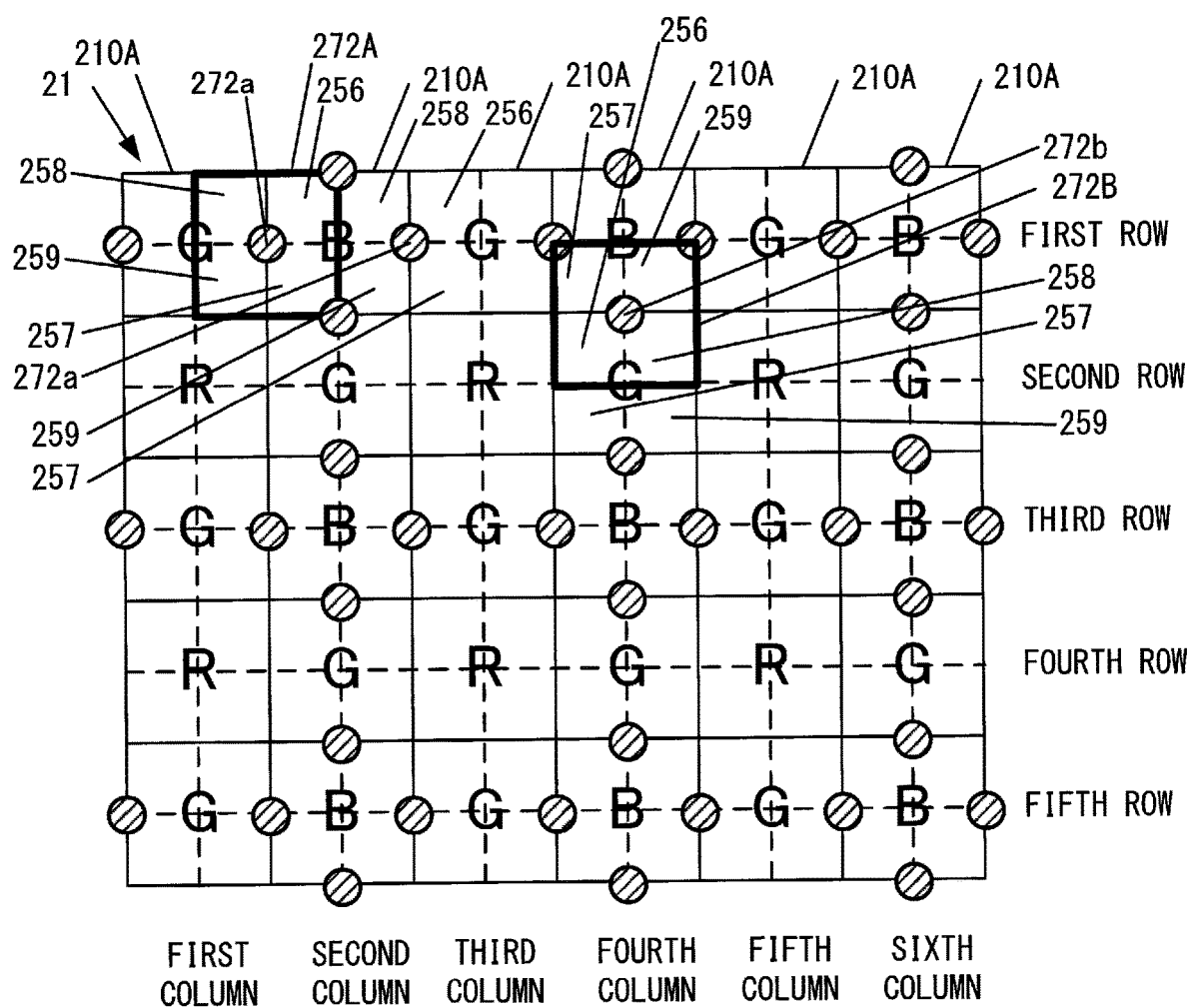

FIG. 18 shows cyan virtual pixels 272A each positioned at the intermediate portion between an "G" pixel 210A and a "B" pixel 210A disposed next to each other along the row direction, i.e., the left/right direction, together with gravitational center positions 272a of the cyan virtual pixels 271A, and also shows cyan virtual pixels 272B each positioned at the intermediate portion between an "R" pixel 210A and a "G" pixel 210A disposed next to each other along the column direction, i.e., the up/down direction, together with gravitational center positions 272b of the cyan virtual pixels 271B.

The cyan virtual pixels 272A are each constituted with the third and fourth photoelectric conversion areas 258 and 259 in a "G" pixel 210A and the first and second photoelectric conversion areas 256 and 257 in the "B" pixel 210A disposed next to the "G" pixel 210A along the row direction or with the third and fourth photoelectric conversion areas 258 and 259 in a "B" pixel 210A and the first and second photoelectric conversion areas 256 and 257 in the "G" pixel 210A disposed next to the "B" pixel 210A along the row direction.

In addition, the cyan virtual pixels 271B are each constituted with the second and fourth photoelectric conversion areas 257 and 259 in a "B" pixel 210A and the first and third photoelectric conversion areas 256 and 258 in the "G" pixel 210A disposed next to the "B" pixel 210A along the column direction, or with the second and fourth photoelectric conversion areas 257 and 259 in a "G" pixel 210A and the first and third photoelectric conversion areas 256 and 258 in the "B" pixel 210A disposed next to the "G" pixel 210A along the column direction.

First, the cyan virtual pixels 272A each positioned at the intermediate portion between a "G" pixel 210A and a "B" pixel 210A disposed next to each other along the row direction will be explained. The image generation unit 12d generates a sum pixel signal by adding together, for instance, the photoelectric conversion signals obtained from the third and fourth photoelectric conversion areas 258 and 259 in the "G" pixel 210A disposed at the first row/first column position in FIG. 18 and the photoelectric conversion signals obtained from the first and second photoelectric conversion areas 256 and 257 in the "B" pixel 210A disposed at the first row/second column position.

This sum pixel signal, generated by adding together the photoelectric conversion signals related to light in the green (G) wavelength range, provided from the third and fourth photoelectric conversion areas 258 and 259 in the "G" pixel 210A, and the photoelectric conversion signals related to light in the blue (B) wavelength range, provided from the first and second photoelectric conversion areas 256 and 257 in the "B" pixel 210A, is equivalent to a pixel signal from a virtual pixel 272A corresponding to cyan (Cy), which is constituted with the third and fourth photoelectric conversion areas 258 and 259 in the "G" pixel 210A and the first and second photoelectric conversion areas 256 and 257 in the "B" pixel 210A.

The cyan (Cy) virtual pixel 272A is offset both from the "G" pixel 210A and from the "B" pixel 210A by a half pitch and the gravitational center position 272a of the virtual pixel 272A is positioned at the boundary area of the "R" pixel 210A and the "G" pixel 210A from each other.

Cyan (Cy) virtual pixels 272A, each positioned at the intermediate portion between a "G" pixel 210A and a "B" pixel 210A disposed next to each other along the row direction, are formed in this manner over the entire image-capturing surface of the first image sensor unit 21.

Next, the cyan virtual pixels 272B each positioned at the intermediate portion between a "G" pixel 210A and a "B" pixel 210A disposed next to each other along the column direction will be explained. The image generation unit 12d generates a sum pixel signal by adding together, for instance, the photoelectric conversion signals obtained from the second and fourth photoelectric conversion areas 257 and 259 in the "B" pixel 210A disposed at the first row/fourth column position and the photoelectric conversion signals obtained from the first and third photoelectric conversion areas 256 and 258 in the "G" pixel 210A disposed at the second row/fourth column position next to the "B" pixel 210A along the column direction.

This sum pixel signal, generated by adding together the photoelectric conversion signals related to light in the blue (B) wavelength range, provided from the second and fourth photoelectric conversion areas 257 and 259 in the "B" pixel 210A, and the photoelectric conversion signals related to light in the green (G) wavelength range, provided from the first and third photoelectric conversion areas 256 and 258 in the "G" pixel 210A, is equivalent to a pixel signal from a virtual pixel 272B corresponding to cyan (Cy), which is constituted with the second and fourth photoelectric conversion areas 257 and 259 in the "B" pixel 210A and the first and third photoelectric conversion areas 256 and 258 in the "G" pixel 210A.

The cyan (Cy) virtual pixel 272B is offset both from the "B" pixel 210A and from the "G" pixel 210A, which are disposed next to each other along the column direction, by a half pitch and the gravitational center position 272b of the virtual pixel 272B is positioned at the boundary area of the "B" pixel 210A and the "G" pixel 210A.

Cyan (Cy) virtual pixels 272A, each positioned at the intermediate portion between a "G" pixel 210A and a "B" pixel 210A disposed next to each other along the column direction, are formed in this manner over the entire image-capturing surface of the first image sensor unit 21.

As described above, virtual pixel signals corresponding to cyan are obtained through cyan virtual pixels 272A and 272B, set over the entire image-capturing surface of the first image sensor unit 21, each positioned at the intermediate portion between a "B" pixel 210A and a "G" pixel 210A disposed next to each other along the row direction or the column direction.

(3) Magenta Virtual Pixels

Figure 19:
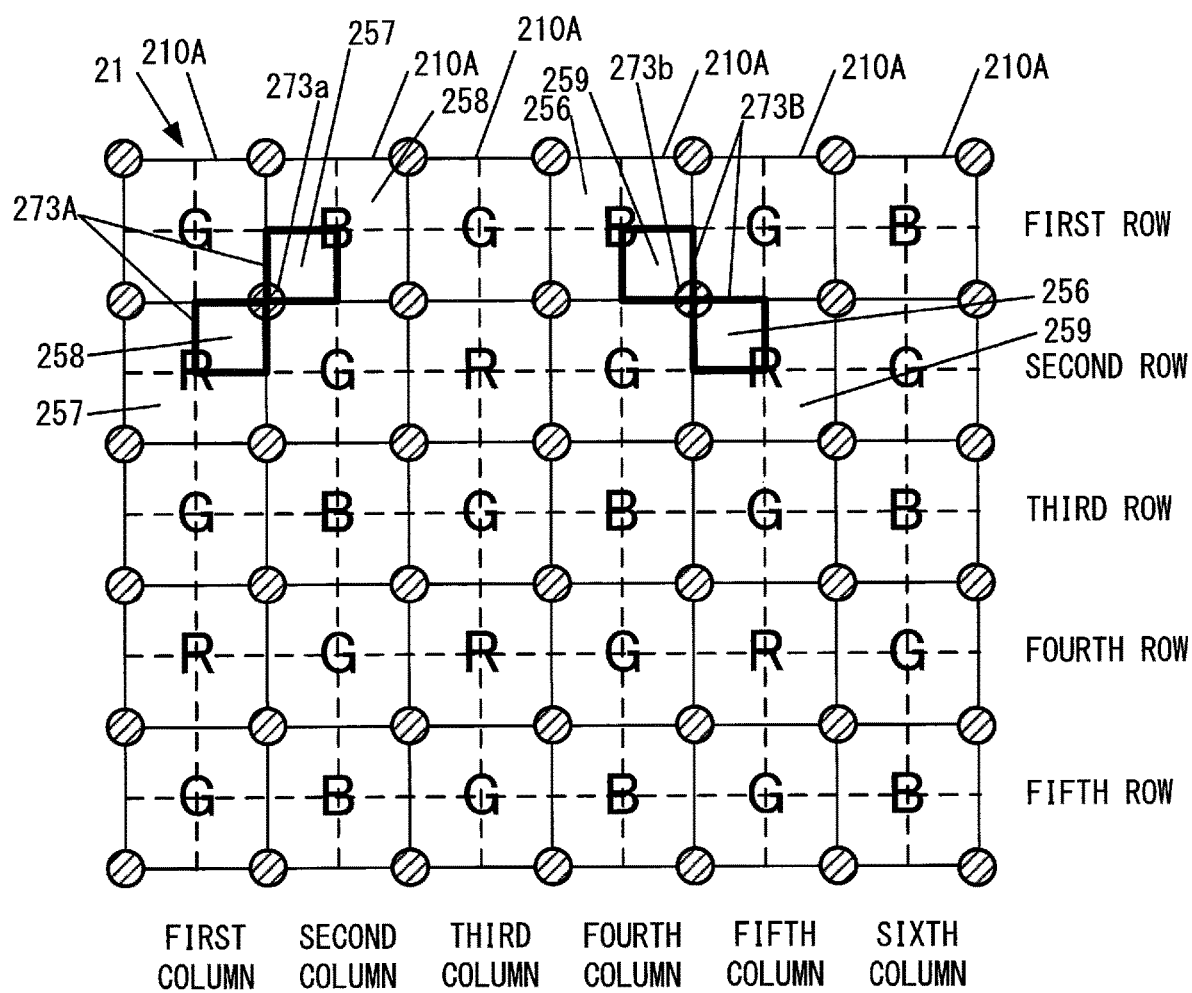

FIG. 19 shows magenta virtual pixels 273A each positioned at the intermediate portion between an "R" pixel 210A and a "B" pixel 210A disposed next to each other along one of directions of the diagonals of a pixel 210A, together with gravitational center positions 273a of the magenta virtual pixels 273A, and also shows magenta virtual pixels 273B positioned at the intermediate portion between an "R" pixel and a "B" pixel 210A disposed next to each other along the other of directions of the diagonals of the pixel 210A, together with gravitational center positions 273b of the magenta virtual pixels 273B.

The magenta virtual pixels 273A are each constituted with the third photoelectric conversion area 258 in an "R" pixel 210A and the second photoelectric conversion area 257 in the "B" pixel 210A disposed next to each other along one of directions of the diagonals from the third photoelectric conversion area 258, or with the third photoelectric conversion area 258 in a "B" pixel 210A and the second photoelectric conversion area 257 in the "R" pixel 210A disposed next to each other along the other directions of the diagonals from the third photoelectric conversion area 258.

In addition, the magenta virtual pixels 273B are each constituted with the fourth photoelectric conversion area 259 in a "B" pixel 210A and the first photoelectric conversion area 256 in the "R" pixel 210A disposed next to each other along one of directions of the diagonals from the fourth photoelectric conversion area 259, or with the fourth photoelectric conversion area 259 in an "R" pixel 210A and the first photoelectric conversion area 256 in the "B" pixel 210A disposed next to each other along the other of directions of the diagonals from the fourth photoelectric conversion area 259.

First, the magenta virtual pixels 273A, each positioned at the intermediate portion between an "R" pixel 210A and a "B" pixel 210A disposed next to each other along one of directions of the diagonals, will be explained. The image generation unit 12d generates a sum pixel signal by adding together, for instance, the photoelectric conversion signal obtained from the third photoelectric conversion area 258 in the "R" pixel 210A disposed at the second row/first column position in FIG. 19 and the photoelectric conversion signal obtained from the second photoelectric conversion area 257 in the "B" pixel 210A disposed at the first row/second column position.

This sum pixel signal, generated by adding together the photoelectric conversion signal related to light in the red (R) wavelength range, provided from the third photoelectric conversion area 258 in the "R" pixel 210A, and the photoelectric conversion signal related to light in the blue (B) wavelength range, provided from the second photoelectric conversion area 257 in the "B" pixel 210A, is equivalent to a pixel signal from a virtual pixel 273A corresponding to magenta (Mg), which is constituted with the third photoelectric conversion area 258 in the "R" pixel 210A and the second photoelectric conversion area 257 in the "B" pixel 210A.

The magenta (Mg) virtual pixels 273A are set with a pitch that is half the array pitch with which pixels 210A are disposed along the diagonal direction, and the gravitational center position 273a of the virtual pixel 272A is positioned at the boundary between the "R" pixel 210A and the "B" pixel 210A disposed next to each other along one of directions of the diagonals.

Magenta (Mg) virtual pixels 273A, each positioned at the intermediate portion between an "R" pixel 210A and a "B" pixel 210A disposed next to each other along one of directions of the diagonals, are formed in this manner over the entire image-capturing surface of the first image sensor unit 21.

Next, the magenta virtual pixels 273B each positioned at the intermediate portion between an "R" pixel 210A and a "B" pixel 210A disposed next to each other along the other of directions of the diagonals of a pixel 210A, will be explained. The image generation unit 12d generates a sum pixel signal by adding together, for instance, the photoelectric conversion signal obtained from the fourth photoelectric conversion area 259 in the "B" pixel 210A disposed at the first row/fourth column position in FIG. 19 and the photoelectric conversion signal obtained from the first photoelectric conversion area 256 in the "R" pixel 210A disposed at the second row/fifth column position.

This sum pixel signal, generated by adding together the photoelectric conversion signal related to light in the blue (B) wavelength range, provided from the fourth photoelectric conversion area 259 in the "B" pixel 210A, and the photoelectric conversion signal related to light in the red (R) wavelength range, provided from the first photoelectric conversion area 256 in the "R" pixel 210A, is equivalent to a pixel signal from a virtual pixel 273B corresponding to magenta (Mg), which is constituted with the fourth photoelectric conversion area 259 in the "B" pixel 210A and the first photoelectric conversion area 256 in the "R" pixel 210A.

The magenta (Mg) virtual pixels 273B are set with a pitch that is half the array pitch with which pixels 210A are disposed along the diagonal direction, and the gravitational center position 273b of the virtual pixel 273B is positioned at the boundary between the "B" pixel 210A and the "R" pixel 210A disposed next to each other along the other of directions of the diagonals.

Magenta (Mg) virtual pixels 273B, each positioned at the intermediate portion between a "B" pixel 210A and an "R" pixel 210A disposed next to each other along the other of directions of the diagonals, are formed in this manner over the entire image-capturing surface of the first image sensor unit 21.

As described above, virtual pixel signals corresponding to magenta are obtained through magenta virtual pixels 273A and 273B, set over the entire image-capturing surface of the first image sensor unit 21, each positioned at the intermediate portion between a "B" pixel 210A and an "R" pixel 210A disposed next to each other along one of directions of the diagonals of the "B" pixel or "R" or along the other of directions of the diagonals.

It is to be noted that the virtual pixel signals obtained from the magenta virtual pixels 273A and 273B, as described above, each represent the sum of photoelectric conversion signals provided from two photoelectric conversion areas, i.e., the sum of the photoelectric conversion signal from one photoelectric conversion area in an "R" pixel and the photoelectric conversion signal from one photoelectric conversion area in a "B" pixel. The yellow virtual pixel signals and cyan virtual pixel signals explained earlier are different in that they each represent the sum of photoelectric conversion signals provided from four photoelectric conversion areas. Accordingly, the magenta virtual pixel signals are amplified so as to, for instance, double their signal strength before they are used in the image processing unit 14, as will be described later.

—Generation of High-Resolution Image Data—

Figure 20:
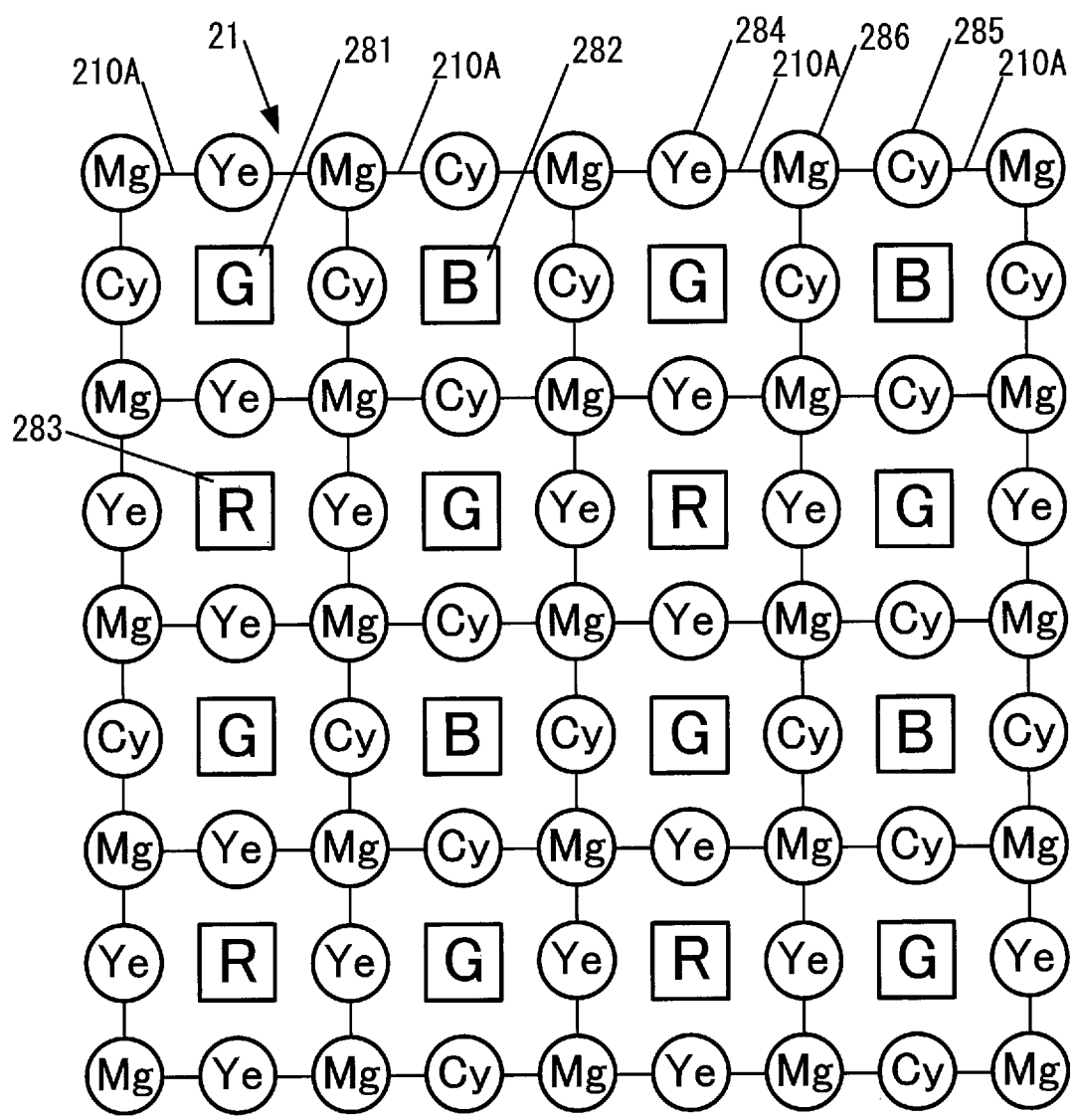

FIG. 20 indicates the positions of the pixel gravitational centers of the "R", "G" and "B" pixels 210A and the positions of the pixel gravitational centers of the yellow, cyan and magenta virtual pixels in the first image sensor unit 21. FIG. 20 indicates that gravitational center positions 281 of the "G" pixels 210A that output green pixel signals, gravitational center positions 282 of the "B" pixels 210A that output blue pixel signals and gravitational center positions 283 of the "R" pixels 210A that output red pixel signals are arrayed in a pattern in accordance with the array pattern with which the "G", "B" and "R" pixels 210A are disposed as shown in FIG. 13(a).

Gravitational center positions 284 of the virtual pixels that output yellow virtual pixel signals, gravitational center positions 285 of the virtual pixels that output cyan virtual pixel signals and gravitational center positions 286 of the virtual pixels that output magenta virtual pixel signals are positioned around the gravitational center positions 281 of the "G" pixels, the gravitational center positions 282 of the "B" pixels and the gravitational center positions 283 of the "R" pixels, in patterns respectively matching the pattern with which the pixel gravitational centers 271a and 271b are set as shown in in FIG. 17, the pattern with which the pixel gravitational centers 272a and 272b are set as shown in FIG. 18 and the pattern with which the pixel gravitational centers 273a and 273b are set as shown in FIG. 19.

As described above, the pixel gravitational centers 284, 285 and 286 of the yellow virtual pixels, the cyan virtual pixels and the magenta virtual pixels are set along the row direction, the column direction and the diagonal directions with a pitch that is half the pitch with which the pixel gravitational centers 281, 282 and 283 of the green "G", blue "B" and red "R" pixels 210A are set.

The image generation unit 12d shown in FIG. 12 generates yellow, cyan and magenta virtual pixel signals based upon the first pixel signals provided from the "R", "G" and "B" pixels 210A in the first image sensor unit 21, as described above. The image processing unit 14 in FIG. 12 generates first RGB image data based upon the pixel signals provided from the "R", "G" and "B" pixels 210A in the first image sensor unit 21, also generates CMY image data based upon the yellow, cyan and magenta virtual pixel signals provided by the image generation unit 12*d*, and then converts the CMY image data to second RGB image data through color system conversion processing.

The image processing unit 14 generates RGB high-resolution image data by using the first RGB image data and the second RGB image data.

Next, a first variation of the second embodiment will be described.

Figure 21:
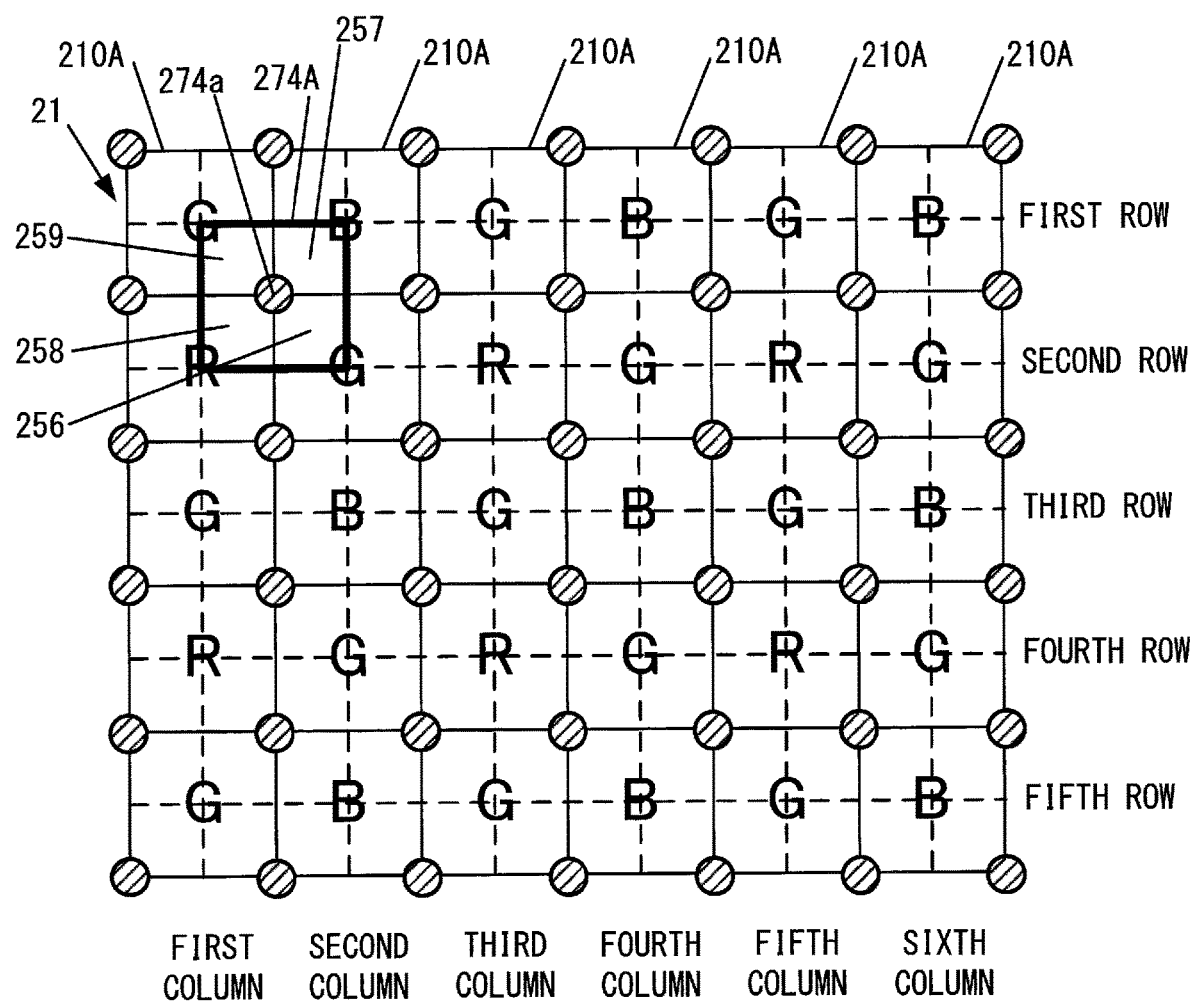

While yellow (Ye) virtual pixels, cyan (Cy) virtual pixels and magenta (Mg) virtual pixels are set in the embodiment described above, (R+B+G+G) virtual pixels are set in the first variation instead of setting magenta (Mg) virtual pixels. It is to be noted that since the (R+B+G) portion of the (R+B+G+G) is equivalent to white (W), (R+B+G+G) will be notated as (W+G). FIG. 21 shows (R+B+G+G) virtual pixel 274A, set at the central position of four pixels 210A of 2 rows×2 columns, together with gravitational center positions 274*a* of the (R+B+G+G) virtual pixels.

The (W+G) virtual pixels 274A are each constituted with the fourth photoelectric conversion area 259, the third photoelectric conversion area 258, the second photoelectric conversion area 257 and the first photoelectric conversion area 256 respectively belonging to the upper left pixel 210A, the lower left pixel 210A, the upper right pixel 210A and the lower right pixel 210A among the four pixels 210A of 2 rows×2 columns.

The image generation unit 12*d* generates a sum pixel signal, for instance, by adding together the photoelectric conversion signals provided from the fourth photoelectric conversion area 259 in the "G" pixel 210A disposed at the first row/first column position, the photoelectric conversion signal provided from the third photoelectric conversion area 258 in the "R" pixel 210A disposed at the second row/first column position, the photoelectric conversion signal provided from the second photoelectric conversion area 257 in the "B" pixel 210A disposed at the first row/second column position and the photoelectric conversion signal provided from the first photoelectric conversion area 256 in the "G" pixel 210A disposed at the second row/second column position. This sum pixel signal is a virtual pixel signal from the (R+B+G+G) virtual pixel 274A.

Virtual pixel signals are generated by setting (W+G) virtual pixels 274A over the entire image-capturing surface of the first image sensor unit 21.

As in the second embodiment, yellow (Ye) virtual pixels 271A and 271B are set as shown in FIG. 17 and virtual pixel signals corresponding to the virtual pixels are generated. In addition, cyan virtual pixels 272A and 272B are set as shown in FIG. 18 and virtual pixel signals corresponding to the virtual pixels are generated.

Figure 22:
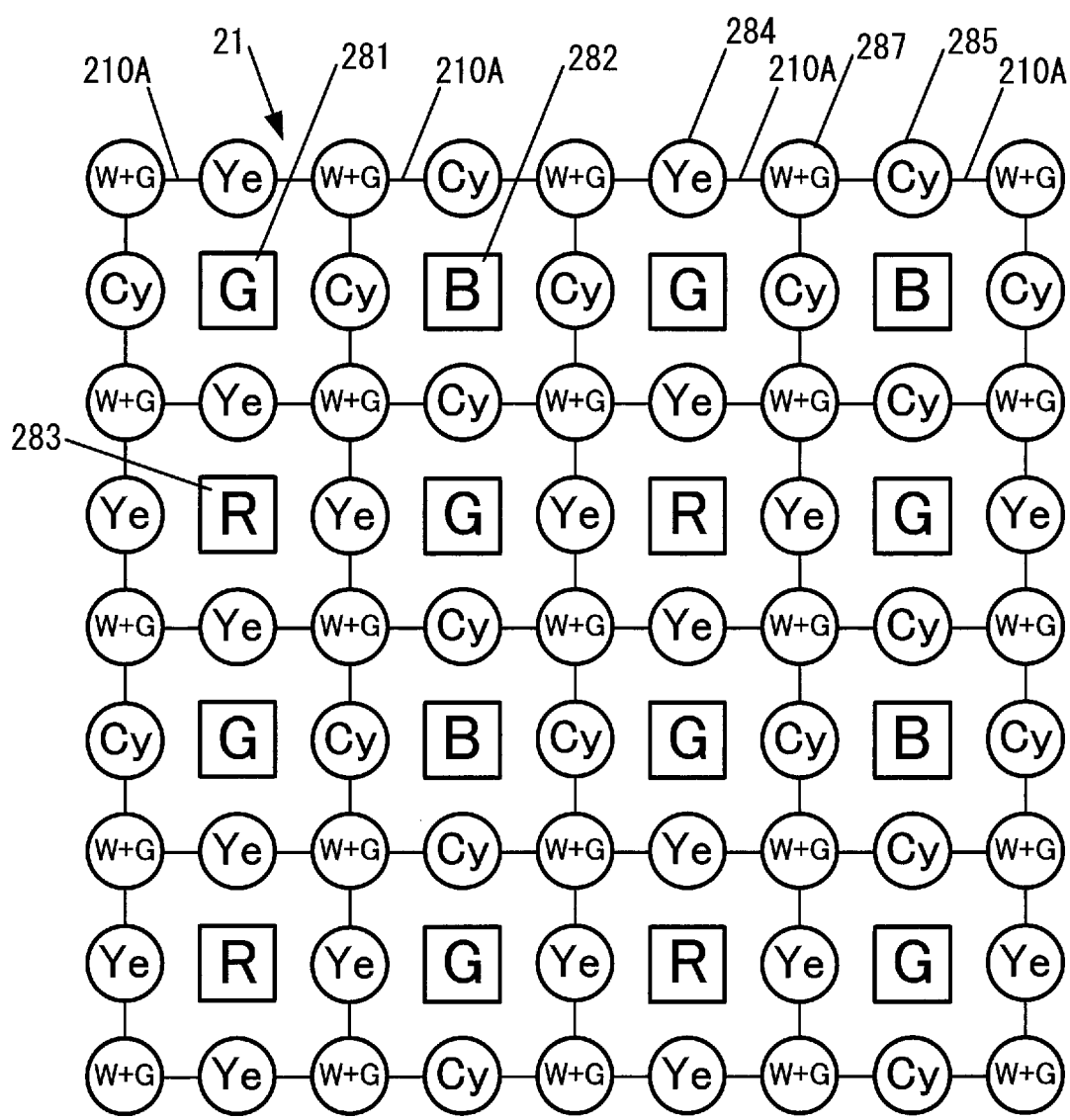

FIG. 22 indicates the positions of the pixel gravitational centers of the "R", "G" and "B" pixels 210A and the positions of the pixel gravitational centers of the yellow, cyan and (W+G) virtual pixels in the first image sensor unit 21. FIG. 22 indicates that gravitational center positions 281 of the "G" pixels 210A that output green pixel signals, gravitational center positions 282 of the "B" pixels 210A that output blue pixel signals and gravitational center positions 283 of the "R" pixels 210A that output red pixel signals are arrayed in a pattern in accordance with the array pattern with which the "G", "B" and "R" pixels 210A are disposed as shown in FIG. 13(*a*).

Gravitational center positions 284 of the virtual pixels that output yellow virtual pixel signals, gravitational center positions 285 of the virtual pixels that output cyan virtual pixel signals and gravitational center positions 287 of the virtual pixels that output (W+G) virtual pixel signals are positioned around the gravitational center positions 281 of the "G" pixels, the gravitational center positions 282 of the "B" pixels and the gravitational center positions 283 of the "R" pixels in patterns respectively in accordance with the patterns with which the pixel gravitational centers 271*a* and 271*b* are set as shown in in FIG. 17, the pattern with which the pixel gravitational centers 272*a* and 272*b* are set as shown in FIG. 18 and the pattern with which the pixel gravitational centers 274*a* are set as shown in FIG. 21.

As described above, the pixel gravitational centers 284, 285 and 287 of the yellow virtual pixels, the cyan virtual pixels and the (W+G) virtual pixels are arrayed along the row direction, the column direction and the diagonal directions with a pitch that is half the pitch with which the pixel gravitational centers 281, 282 and 283 of the green "G", blue "B" and red "R" pixels 210A are set.

The image generation unit 12*d* shown in FIG. 12 generates yellow, cyan and (W+G) virtual pixel signals based upon the first pixel signals provided from the "R", "G" and "B" pixels 210A in the first image sensor unit 21, as described above. The image processing unit 14 shown in FIG. 12 generates first RGB image data based upon the pixel signals provided from the "R", "G" and "B" pixels 210A in the first image sensor unit 21, also generates CMY image data based upon the yellow, cyan and (W+G) virtual pixel signals provided by the image generation unit 12*d*, and then converts the CMY image data to second RGB image data through color system conversion processing.

The image processing unit 14 generates RGB high-resolution image data by using the first RGB image data and the second RGB image data.

A second variation of the second embodiment will be explained next.

In the second embodiment, virtual pixel signals corresponding to virtual pixels are generated by using photoelectric conversion signals provided from the photoelectric conversion areas in the pixels disposed at the first image sensor unit 21 and high-resolution image data are generated based upon the pixel signals output from the individual pixels in the first image sensor unit 21 and the virtual pixel signals. In the second variation, virtual pixel signals corresponding to virtual pixels are generated by using the photoelectric conversion signals provided from the photoelectric conversion areas in the pixels at the first image sensor unit 21 and then high-resolution image data are generated based upon the virtual pixel signals and the pixel signals output from the individual pixels in the second image sensor unit 22.

The image generation unit 12*d* generates yellow (Ye), cyan (Cy) and magenta (Mg) or (W+G) virtual pixel signals based upon photoelectric conversion signals provided from the photoelectric conversion areas in the individual pixels at the first image sensor unit 21. Yellow (Ye), cyan (Cy) and magenta (Mg) pixel signals are output as second pixel signals from the "Ye", "Cy" and "Mg" pixels 220 in the second image sensor unit 22. The image processing unit 14 generates high-resolution image data based upon the second pixel signals provided from the second image sensor unit 22 and the yellow, cyan and magenta or (W+G) virtual pixel signals.

Next a third variation of the second embodiment will be described.

(1) The pixels 210A in the second embodiment described above each include the first through fourth partial electrodes 234*a*, 234*b*, 234*c* and 234*d* disposed along the row direction and the column direction in a 2×2 pattern. As an alternative, the first image sensor unit 21 may include pixels 210A each having two partial electrodes disposed side-by-side either along the row direction or the column direction. In conjunction with the pixels 210A, each having a first partial electrode and a second partial electrode disposed side-by-side along the row direction, a virtual pixel is formed with the second partial electrode, i.e., the second photoelectric conversion area in one pixel 210A with a specific spectral sensitivity, paired up with another pixel 210A disposed next to it and assuming a different spectral sensitivity, and the first partial electrode (the partial electrode located closer to the second partial electrode in the one pixel) i.e., the first photoelectric conversion area, in the other pixel 210A, and a virtual pixel is also formed with the first partial electrode, i.e., the first photoelectric conversion area, in one pixel 210A assuming a specific spectral sensitivity paired up with another pixel 210A disposed next to it and assuming a different spectral sensitivity, and the second partial electrode (the partial electrode located closer to the first partial electrode in the one pixel) i.e., the second photoelectric conversion area, in the other pixel 210A.

In conjunction with pixels 210 each having the first and second partial electrodes disposed side-by-side along the row direction as described above, each virtual pixel can be positioned at the intermediate portion between two pixels 210A having different spectral sensitivity characteristics, disposed next to each other along the row direction, and the resolution of the image data, generated based upon the first pixel signals or the second pixel signals provided from the first image sensor unit 21 or the second image sensor unit 22, can be improved along the row direction by using the virtual pixel signals generated in correspondence to these virtual pixels.

In conjunction with pixels 210A each having a first partial electrode and a second partial electrode disposed side-by-side along the column direction, each virtual pixel can be positioned at the intermediate portion between two pixels 210A having different spectral sensitivity characteristics, disposed next to each other along the column direction, and the resolution of image data generated based upon the first pixel signals or the second pixel signals provided from the first image sensor unit 21 or the second image sensor unit 22 can be improved along the column direction by using the virtual pixel signals generated in correspondence to these virtual pixels.

A fourth variation of the second embodiment will be explained next.

(2) In the second embodiment described above, virtual pixels are each set in conjunction with two pixels 210A having different spectral sensitivity characteristics disposed next to each other along the row direction, virtual pixels are each set in conjunction with two pixels 210A having different spectral sensitivity characteristics disposed next to each other along the column direction, and virtual pixels are also set each in conjunction with two pixels 210A having different spectral sensitivity characteristics disposed next to each other along a diagonal direction. As an alternative, virtual pixels may each be positioned at the intermediate portion between two pixels 210A having different spectral sensitivity characteristics disposed next to each other only along, at least, one direction among the three directions, i.e., the row direction, the column direction and the diagonal direction.

In addition to the advantageous effects achieved through the first embodiment, the second embodiment described above realizes the following advantageous effects.

(1) The first image sensor unit 21 is configured so that its pixels 210A each include first through fourth partial electrodes 234*a*, 234*b*, 234*c* and 234*d* disposed along the row direction and the column direction in a 2×2 pattern. In conjunction with two pixels 210A having different spectral sensitivity characteristics, disposed next to each other along the row direction, the image generation unit 12*d* generates a sum pixel signal by adding together the two photoelectric conversion signals generated based upon the two partial electrodes, among the first through fourth partial electrodes 234*a* through 234*d* in one pixel 210A, which are located closer to the other pixel 210A, and two photoelectric conversion signals generated based upon the two partial electrodes, among the first through fourth partial electrodes 234*a* through 234*d* in the other pixel 210A, which are located closer to the one pixel 210A. In addition, in conjunction with two pixels 210A having different spectral sensitivity characteristics, disposed next to each other along the column direction, the image generation unit 12*d* generates a sum pixel signal by adding together the two photoelectric conversion signals generated based upon the two partial electrodes, among the first through fourth partial electrodes 234*a* through 234*d* in one pixel 210A, which are located closer to the other pixel 210A, and two photoelectric conversion signals generated based upon the two partial electrodes, among the first through fourth partial electrodes 234*a* through 234*d* in the other pixel 210A, which are located closer to the one pixel 210A.

As a result, the array pitch for the pixels and the virtual pixels can be halved both along the row direction and the column direction, which, in turn, makes it possible to increase the resolution of the image data obtained through a single image-capturing operation and improve the image quality.

(2) The image processing unit 14 generates image data based upon yellow, cyan and magenta virtual pixel signals in addition to the first image signals explained earlier. Thus, image data achieving higher resolution than image data generated based upon the first image signals alone can be obtained.

—Third Embodiment—

Figure 24:
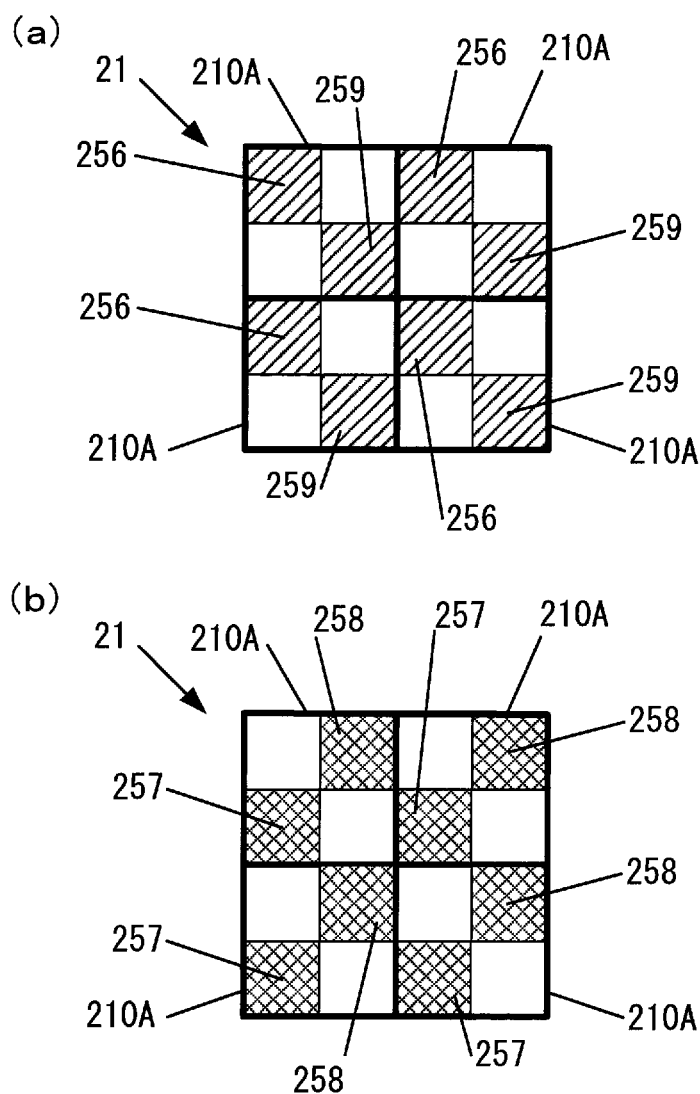
Figure 25:
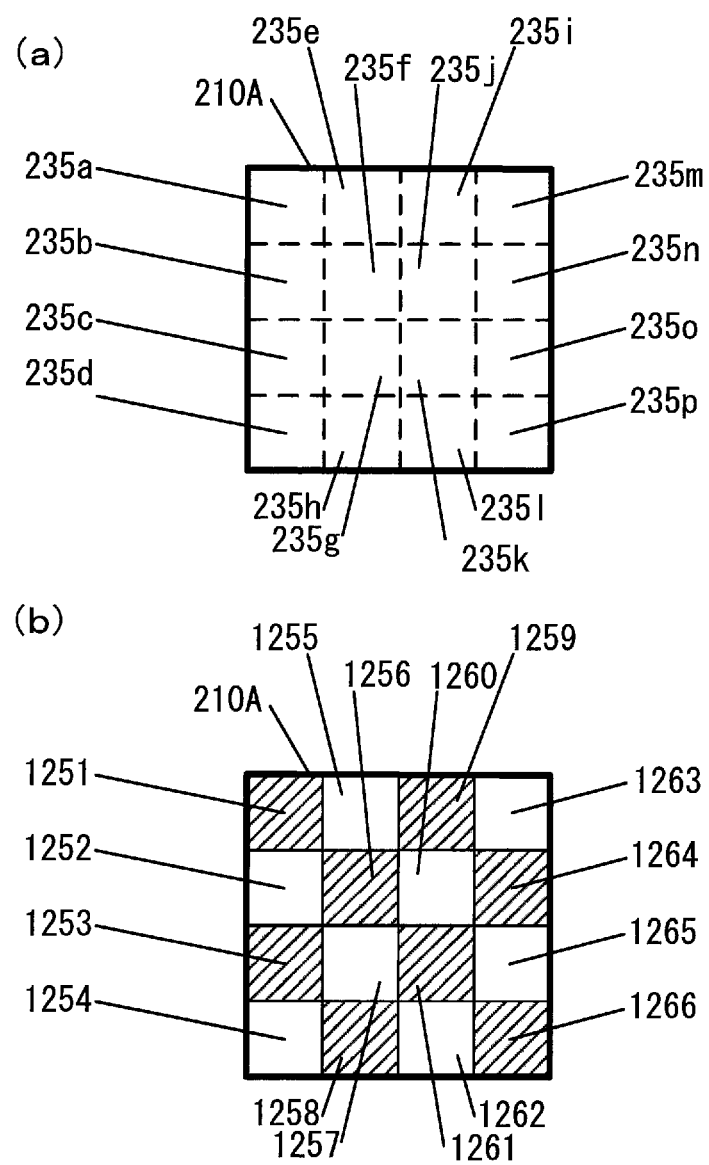

In reference to FIGS. 23 through 25, the third embodiment will be described. The following explanation focuses on features distinguishing the third embodiment from the first and second embodiments with the same reference signs assigned to structural elements identical to those in the first and second embodiments. Aspects that are not specifically noted should be assumed to be identical to those in the first and second embodiments. In this embodiment, a high dynamic range image is obtained.

Figure 23:
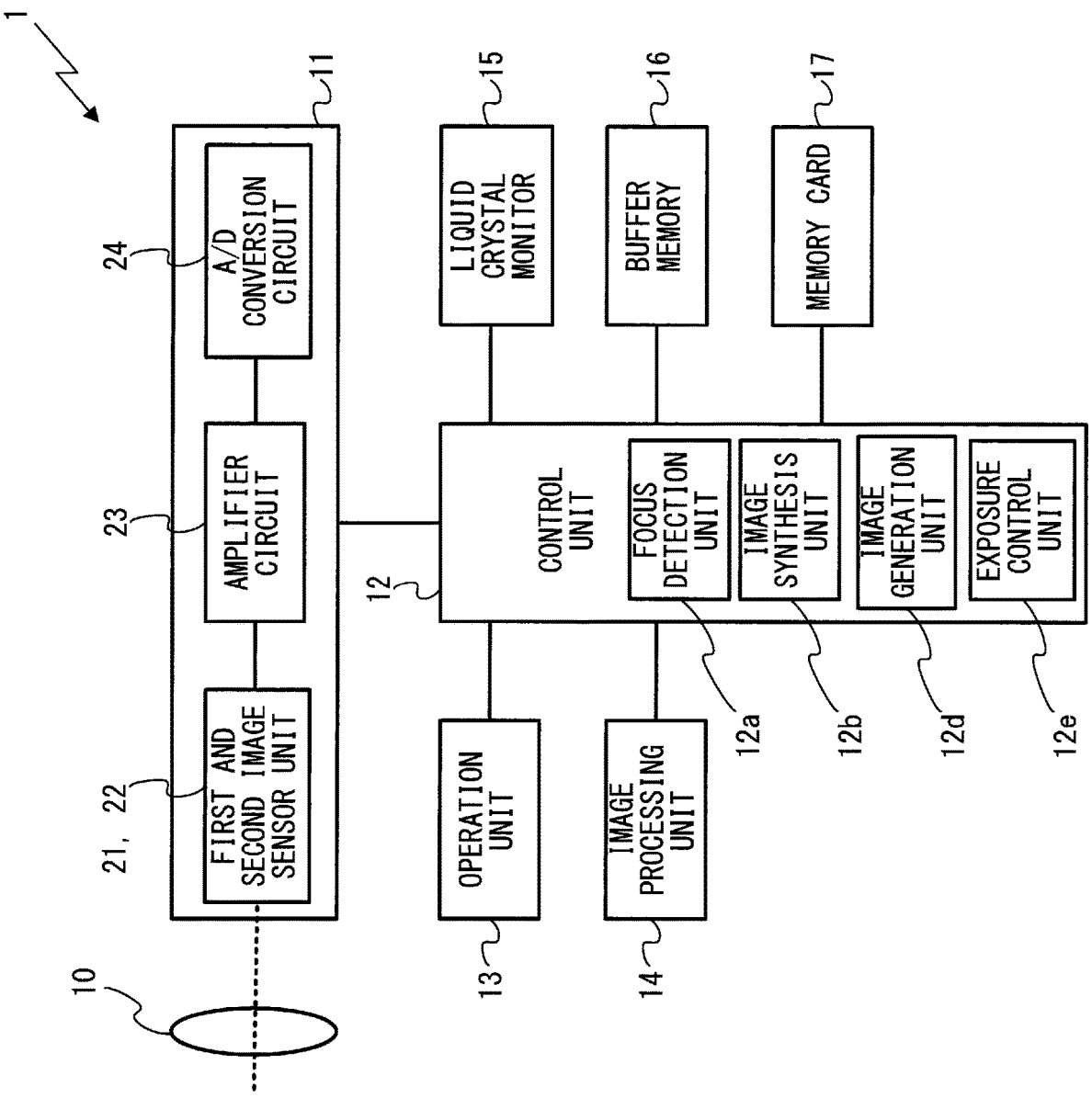

FIG. 23 presents an example of a structure that may be adopted in the digital camera 1 in the third embodiment. The digital camera 1 according to the third embodiment is structurally distinguishable from the digital camera 1 in the second embodiment shown in FIG. 12 in that the control unit 12 further includes an exposure control unit 12*e* in the form of a functional unit. The exposure control unit 12*e* controls exposure parameters in the first and second image sensor units 21 and 22, as will be explained later. It is to be noted that the first and second sensor units 21 and 22 start executing image-capturing operations, i.e., exposure operations simultaneously, as in the first embodiment.

Figure 14:
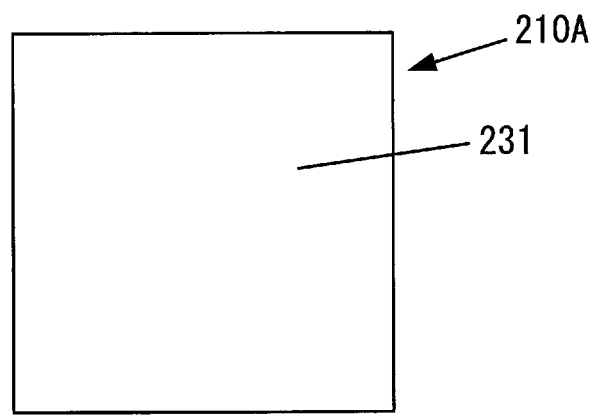
FIG. 14 Illustrations of a pixel at the image sensor with (a) presenting a plan view from the subject side, (b) presenting a side elevation of the pixel, and (c) indicating the positional arrangement of the first through fourth partial electrodes, viewed from the subject side FIG. 15 A diagram presenting a structural example that may be adopted for the signal readout circuit at a pixel in the first image sensor unit FIG. 16 A diagram indicating the correspondence between the partial electrodes and the photoelectric conversion areas FIG. 17 A diagram indicating how yellow virtual pixels are set FIG. 18 A diagram indicating how cyan virtual pixels are set FIG. 19 A diagram indicating how magenta virtual pixels are set FIG. 20 A diagram indicating the pixel gravitational center positions of "R", "G" and "B" pixels and the pixel gravitational center positions of yellow virtual, cyan and magenta pixels in the first image sensor unit FIG. 21 A diagram indicating how (R+B+G+G) virtual pixels are set FIG. 22 A diagram indicating the pixel gravitational center positions of "R", "G" and "B" pixels and the pixel gravitational center positions of yellow virtual, cyan and (W+G) pixels in the first image sensor unit FIG. 23 A diagram presenting an example of a structure that may be adopted in a digital camera according to a third embodiment FIG. 24 Diagrams indicating how the individual photoelectric conversion areas are grouped together FIG. 25 Illustrations of a variation of the third embodiment
Figure 14:
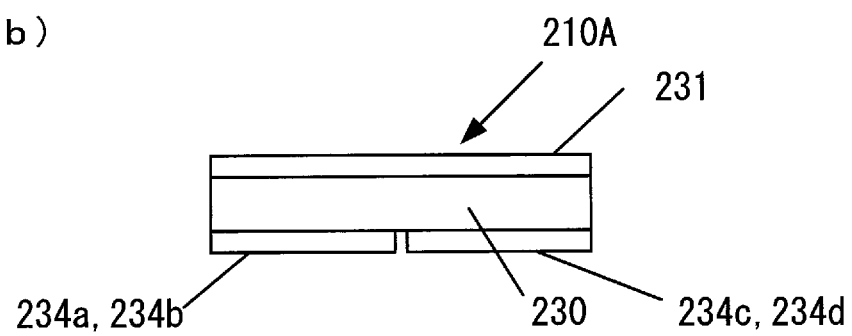
Figure 14:
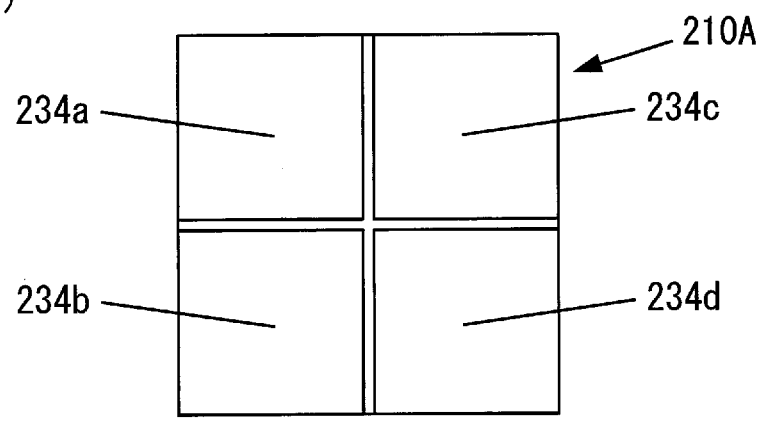

The first and second image sensor units 21 and 22 in the third embodiment adopt structures identical to those of the first and second image sensor units 21 and 22 in the second embodiment illustrated in FIGS. 13 through 16. Namely, pixels 210A in the first image sensor unit 21 each include first through fourth partial electrodes 234a, 234b, 234c and 234d, as shown in FIG. 14, and thus, first through fourth photoelectric conversion areas 256, 257, 258 and 259 are formed in each pixel 210A, as shown in FIG. 16. Pixels 220 in the second image sensor unit 22 each include a single photoelectric conversion unit such as that shown in FIG. 5.

—Exposure Control Executed for the First and Second Image Sensor Units 21 and 22—

The exposure control unit 12e calculates, based upon subject luminance detected in a live-view image obtained through image-capturing operations repeatedly executed in, for instance, the second image sensor unit 22 over predetermined time intervals (e.g., 60 frames/sec), an optimal exposure time, i.e., a charge accumulation time for the individual pixels, required to achieve optimal exposure, and an optimal sensitivity level for the image sensor unit 22, i.e., an optimal amplification factor to be set for the amplifier circuit 23 for optimal exposure. The exposure control unit 12e then sets the optimal exposure time for the second image sensor unit 22 so as to achieve the optimal exposure and also sets the optimal amplification factor for the amplifier circuit 23 so as to achieve the optimal exposure.

In addition, the exposure control unit 12e executes control so as to set an exposure time less than the optimal exposure time for some photoelectric conversion areas among the first through fourth photoelectric conversion areas in each pixel 210A at the first image sensor unit 21 and set an exposure time exceeding the optimal exposure time for the remaining photoelectric conversion areas. To describe this concept in more specific detail in reference to FIG. 24 showing pixels 210A of 2 rows×2 columns in the first image sensor unit 21, the exposure control unit 12e sets an exposure time (charge accumulation time) less than the optimal exposure time for the first and fourth photoelectric conversion areas 256 and 259, disposed next to each other along one of directions of the diagonal, among the first through fourth photoelectric conversion areas 256 through 259 in each pixel 210A, and sets an exposure time (charge accumulation time) exceeding the optimal exposure time for the second and third photoelectric conversion areas 257 and 258, disposed side-by-side along the other of directions of the diagonals.

Image-capturing operations start simultaneously in the first and the second image sensor units 21 and 22 with the exposure times set as described above. In other words, exposure (charge accumulation) starts in the first and second image sensor units 21 and 22 at the same time. As a result, image signals expressing an image captured through the optimal exposure are output from the pixels 220 in the second image sensor unit 22, whereas photoelectric conversion signals resulting from the image-capturing operation executed in an under-exposure condition, are obtained from the first and fourth photoelectric conversion areas 256 and 259 in the individual pixels 210A and photoelectric conversion signals resulting from the image-capturing operation executed in an over-exposure condition are obtained from the second and third photoelectric conversion areas 257 and 258 in the pixels 210A at the first image sensor unit 21.

The image generation unit 12d generates an under-exposure pixel signal by adding together the photoelectric conversion signals from the first and fourth photoelectric conversion areas 256 and 259 in each pixel 210A and also generates an over-exposure pixel signal by adding together the photoelectric conversion signals from the second and third photoelectric conversion areas 257 and 258 in each pixel 210A.

Based upon the under-exposure pixel signals and the over-exposure pixel signals provided from the first image sensor unit 21 and the pixel signals obtained under the optimal exposure condition, provided from the second image sensor unit 22, the image processing unit 14 synthesizes a high dynamic range image with an extended dynamic range. Namely, the image processing unit 14 generates image data by using over-exposure pixel signals for a low luminance area, under-exposure pixel signals for a high luminance area and pixel signals obtained under the optimal exposure condition, provided from the second image sensor unit 22, for an intermediate luminance area. Through these measures, high dynamic range image data can be generated while minimizing white-clipping and black-clipping.

It is to be noted that an under-exposure pixel signal is generated based upon the photoelectric conversion signals from the first and fourth photoelectric conversion areas 256 and 259, disposed side-by-side along one of directions of the diagonals in each pixel, as shown in FIG. 24(a), whereas an over-exposure pixel signal is generated based upon the photoelectric conversion signals from the second and third photoelectric conversion areas 257 and 258 disposed side-by-side along the other of directions of the diagonals, as shown in FIG. 24(b) in the embodiment. The rationale for this is that the two areas of the exit pupil at the photographing optical system, through which the two light fluxes to enter the first and fourth photoelectric conversion areas 256 and 259 pass, do not converge on one side and that the two areas of the exit pupil of the photographing optical system, through which the two light fluxes to enter the second and third photoelectric conversion areas 257 and 258 pass, do not converge on one side.

It is to be noted that the size of the combined area of the photoelectric conversion areas 256 and 259 in each pixel 210A used to generate an under-exposure pixel signal, and the size of the combined area of the photoelectric conversion areas 257 and 258 in the pixel 210A, used to generate an over-exposure pixel signal, only amount to half the size of the photoelectric conversion area through which a pixel signal is generated under the optimal exposure condition at the second image sensor unit 22. Accordingly, the image generation unit 12d may amplify under-exposure pixel signals and over-exposure pixel signals by a factor of 2, so as to eliminate any negative effect attributable to this difference in area size.

(1) Next, a first variation of the third embodiment will be described. While under-exposure pixel signals and over-exposure pixel signals are generated by controlling the exposure time (charge accumulation time) in the third embodiment described above, under-exposure/over-exposure pixel signals may be generated by controlling the sensitivity level in the image sensor unit, i.e., by controlling the amplification factor for pixel signals, as an alternative to, or in addition to, the control executed in the third embodiment.

Namely, a first amplification factor at which the optimal exposure is achieved is selected as the amplification factor for the pixel signals from the pixels 220 at the second image sensor unit 22, an amplification factor smaller than the first amplification factor is selected as the amplification factor for the photoelectric conversion signals from the photoelectric conversion areas 256 and 259 in the pixels 210A at the first image sensor unit 21 and an amplification factor higher than the first amplification factor is selected as the amplification factor for the photoelectric conversion signals from the photoelectric conversion areas 257 and 258 in the pixels 210A at the first image sensor unit 21.

(2) The first image sensor unit 21 in the third embodiment described above is configured so that its pixels 210A each include first through fourth partial electrodes 234a, 234b, 234c and 234d disposed along the row direction and the column direction in a 2×2 pattern. As an alternative, the first image sensor unit 21 may be configured so that its pixels 210A each include a first partial electrode and a second partial electrode disposed side-by-side along the row direction or the column direction. In this case, an under-exposure image signal and an over-exposure image signal can be obtained as explained earlier by setting different exposure times for a first photoelectric conversion area corresponding to the area of the organic photoelectric conversion film 230 covered by the first partial electrode and for a second photoelectric conversion area corresponding to the area of the organic photoelectric conversion film 230 covered by the second partial electrode.

(3) In addition, each pixel 210A may include more than four partial electrodes. For instance, the pixels 210A may each include first through 16th partial electrodes 235a through 235p, disposed along the row direction and the column direction in a 4×4 pattern, as shown in FIG. 25(a) i.e., the pixels 210A may each include first through 16th photoelectric conversion areas 1251 through 1266 formed therein. In this case, an under-exposure pixel signal is generated by using the photoelectric conversion signals provided from the shaded photoelectric conversion areas, i.e., the first, third, sixth, eighth, ninth, 11th, 14th and 16th photoelectric conversion areas 1251, 1253, 1256, 1258, 1259, 1261, 1264 and 1266, as indicated in FIG. 25(b). An over-exposure pixel signal is generated by using the photoelectric conversion signals provided from the second, fourth, fifth, seventh, 10th, 12th, 13th and 15th photoelectric conversion areas 1252, 1254, 1255, 1257, 1260, 1262, 1263 and 1265.

The first, third, sixth, eighth, ninth, 11th, 14th, and 16th photoelectric conversion areas 1251, 1253, 1256, 1258, 1259, 1261, 1264 and 1266, used for under-exposure pixel signal generation as described above, and the second, fourth, fifth, seventh, 10th, 12th, 13th and 15th photoelectric conversion areas 1252, 1254, 1255, 1257, 1260, 1262, 1263 and 1265, used for over-exposure pixel signal generation as described above, form a checkered pattern. This means that the first, third, sixth, eighth, ninth, 11th, 14th and 16th photoelectric conversion areas 1251, 1253, 1256, 1258, 1259, 1261, 1264 and 1266, used for under-exposure pixel signal generation, are not disposed next to one another either along the row direction or along the column direction, and likewise, the second, fourth, fifth, seventh, 10th, 12th, 13th and 15th photoelectric conversion areas 1252, 1254, 1255, 1257, 1260, 1262, 1263 and 1265, used for over-exposure pixel signal generation, are not disposed next to one another either along the row direction or along the column direction.

(4) While the first through fourth photoelectric conversion areas in each pixel 210A are divided into a first group (the first and fourth photoelectric conversion areas) and a second group (the second and third photoelectric conversion areas), for which different exposure times or different sensitivity settings are selected so as to generate an under-exposure pixel signal and an over-exposure pixel signal in the third embodiment described above, photoelectric conversion areas may be divided into groups, the number of which is other than two. For instance, the pixels 210A may each include a greater number of partial electrodes (photoelectric conversion areas) and these photoelectric conversion areas may be divided into three or more groups for which different exposure times or sensitivity settings are selected. In this case, three or more under-exposure/over-exposure pixel signals, corresponding to under-exposure/over-exposure conditions relative to the optimal exposure condition, can be generated and as a result, image data achieving an even higher dynamic range can be generated.

(5) While the optimal exposure time in the second image sensor unit 22 so as to achieve the optimal exposure in the third embodiment described earlier, the optimal exposure time may be set for the photoelectric conversion areas in either the first group or the second group at the first image sensor unit 21. In this variation, an exposure time less than the optimal exposure time may be set for the photoelectric conversion areas in the other group and an exposure time greater than the optimal exposure time may be set for the second image sensor unit 22.

(6) While the second image sensor unit 22 in the third embodiment described above includes photoelectric conversion units constituted with photodiodes formed on a semiconductor substrate, the second image sensor unit 22 may instead include photoelectric conversion units constituted with organic photoelectric conversion films, as does the first image sensor unit 21.

(7) While image data are generated by using over-exposure image signals for a dark area, under-exposure image signals for a bright area and image signals provided from the second image sensor unit 22 for an area that is neither dark nor bright in the third embodiment described above, the image processing unit 14 may generate image data simply by using the image signals provided from the second image sensor unit 22 without using any over-exposure image signals or under-exposure image signals for an image that does not include a dark area or a bright area where white-clipping or black-clipping tends to occur.

In addition to the advantageous effects according to the first and second embodiments, the following advantageous effects are realized in the third embodiment described above.

(1) The first through fourth photoelectric conversion areas in each pixel 210A are divided into a first group and a second group. Then, an image-capturing operation is executed by setting different exposure times or different amplification factors for the first group and the second group. Through these measures, two different types of image signals corresponding to different exposure conditions can be obtained, which, in turn, makes it possible to generate image data with an extended dynamic range while minimizing white-clipping or black-clipping.

(2) Since the area size of the photoelectric conversion area in each pixel 220 at the second image sensor unit 22 is greater than the combined area size achieved by the photoelectric conversion areas 256 and 259 or the combined area size achieved by the photoelectric conversion areas 257 and 258 in each pixel 210A at the first image sensor unit 21, an exposure time setting or an amplification factor setting, which will achieve the optimal exposure, is selected for the second image sensor unit 22. As a result, the image data obtained through image-capturing operation executed in the second image sensor unit 22 achieve the optimal exposure, resulting in an improvement in the quality of the image used as the base for the high dynamic range image synthesis, and thus, the quality of the high dynamic range image, too, is ultimately improved.

(3) A high dynamic range image with a greater dynamic range is synthesized based upon the under-exposure pixel signals and the over-exposure pixel signals provided from the first image sensor unit 21 and the pixel signal resulting from the image-capturing operation executed under the optimal exposure condition, provided from the second image sensor unit 22. Thus, a high dynamic range image can be obtained with great ease.

(4) Since exposure starts at the first image sensor unit 21 and at the second image sensor unit 22 simultaneously, image data obtained under the optimal exposure condition, under-exposure image data and over-exposure image data all express images pertaining to the same photographic subject and thus, even if the photographic subject is a moving subject, a high dynamic range image that contains a clear, crisp subject image can be obtained.

It is to be noted that the embodiments and variations thereof described above may be adopted in any combination.

As long as the features characterizing the present invention remain intact, the present invention is not limited to the particulars of the embodiments described above and any other mode conceivable within the scope of the technical teaching of the present invention is within the scope of the present invention.

The disclosure of the following priority application is herein incorporated by reference.

Japanese Patent Application No. 2016-2730, filed Jan. 8, 2016

REFERENCE SIGNS LIST

1; digital camera, 10; photographing optical system, 11; image-capturing unit, 12; control unit, 12b; image synthesis unit, 12c; luminance distribution detection unit, 12d; image generation unit, 12e; exposure control unit, 14; image processing unit, 21; first image sensor unit, 22; second image sensor unit, 23; amplifier unit, 25; partial electrode control unit, 26; readout unit, 210, 210A, 220; pixel, 230; organic photoelectric conversion film, 232; partial electrode, 232a, 234a; first partial electrode, 232b, 234b; second partial electrode, 232c, 234c; third partial electrode, 234d; fourth partial electrode, 251, 256; first photoelectric conversion area, 252, 257; second photoelectric conversion area, 253, 258; third photoelectric conversion area, 259; fourth photoelectric conversion area.

The invention claimed is:

1. An image-capturing device, comprising:
   a first pixel having a first photoelectric conversion unit and a second photoelectric conversion unit that photoelectrically convert light into an electric charge;
   a second pixel having a photoelectric conversion unit that photoelectrically converts light having been transmitted through the first pixel into an electric charge; and
   a control unit that executes control for the photoelectric conversion unit in the second pixel at a first exposure, executes control for the first photoelectric conversion unit in the first pixel at a second exposure different from the first exposure, and executes exposure for the second photoelectric conversion unit in the first pixel at a third exposure different from the first exposure and from the second exposure.

2. The image-capturing device according to claim 1, wherein:
   the first exposure is an optimal exposure value.

3. The image-capturing device according to claim 1, wherein:
   the first pixel outputs a first signal generated based upon the electric charge from the first photoelectric conversion unit and a second signal generated based upon the electric charge from the second photoelectric conversion unit;
   the second pixel outputs a third signal based upon the electric charge from the photoelectric conversion unit; and
   the image-capturing device further comprises an image data generation unit that generates first image data, second image data and third image data respectively based upon the first signal, the second signal and the third signal.

4. The image-capturing device according to claim 1, wherein:
   the first photoelectric conversion unit and the second photoelectric conversion unit each include a plurality of area portions; and
   the area portions in the first photoelectric conversion unit and the area portions in the second photoelectric conversion unit are set so as to together form a checkered pattern.

5. The image-capturing device according to claim 1, wherein:
   the control unit executes the control for the first photoelectric conversion unit at the second exposure greater than the first exposure, and executes the control for the second photoelectric conversion unit at the third exposure smaller than the first exposure.

6. The image-capturing device according to claim 1, wherein:
   the control unit sets a charge accumulation time for the photoelectric conversion unit in the second pixel to a first time, sets a charge accumulation time for the first photoelectric conversion unit to a second time different from the first time, and sets a charge accumulation time for the second photoelectric conversion unit to a third time different from the first time and from the second time.

7. The image-capturing device according to claim 6, wherein:
   the control unit sets the first time to be longer than the second time, and sets the third time to be shorter than the first time.

8. An image-capturing device, comprising:
   a first pixel having a photoelectric conversion unit that photoelectrically converts light into an electric charge;
   a second pixel having a first photoelectric conversion unit and a second photoelectric conversion unit that photoelecrically convert light having been transmitted through the first pixel into an electric charge; and
   a control unit that executes control for the photoelectric conversion unit in the first pixel at a first exposure, executes control for the first photoelectric conversion unit in the second pixel at a second exposure different from the first exposure, and executes control for the second photoelectric conversion unit in the second pixel at a third exposure different from the first exposure and from the second exposure.

9. The image-capturing device according to claim 8, wherein:
   the first pixel outputs a first signal based on the electric charge from the photoelectric conversion unit;
   the second pixel outputs a second signal generated based upon the electric charge from the first photoelectric conversion unit and a third signal generated based upon the electric charge from the second photoelectric conversion unit; and
   the image-capturing device further comprises an image data generation unit that generates first image data, second image data and third image data respectively based upon the first signal, the second signal and the third signal.

10. The image-capturing device according to claim 8, wherein:

the first exposure is an optimal exposure value.

11. The image-capturing device according to claim 8, wherein:

the control unit executes the control for the first photoelectric conversion unit at the second exposure greater than the first exposure, and executes the control for the second photoelectric conversion unit at the third exposure smaller than the first exposure.

12. The image-capturing device according to claim 8, wherein:

the control unit sets a charge accumulation time for the photoelectric conversion unit in the first pixel to a first time, sets a charge accumulation time for the first photoelectric conversion unit to a second time different from the first time, and sets a charge accumulation time for the second photoelectric conversion unit to a third time different from the first time and from the second time.

13. The image-capturing device according to claim 12, wherein:

the control unit sets the first time to be longer than the second time, and sets the third time to be shorter than the first time.

* * * * *